US010202530B2

(12) United States Patent
Fujiwara et al.

(10) Patent No.: US 10,202,530 B2
(45) Date of Patent: Feb. 12, 2019

(54) COMPOSITION FOR HEAT-DISSIPATION MEMBERS, HEAT-DISSIPATION MEMBER, ELECTRONIC DEVICE, AND METHOD OF PRODUCING HEAT DISSIPATING MEMBER

(71) Applicants: JNC CORPORATION, Tokyo (JP); OSAKA MUNICIPAL TECHNICAL RESEARCH INSTITUTE, Osaka (JP)

(72) Inventors: Takeshi Fujiwara, Chiba (JP); Jyunichi Inagaki, Chiba (JP); Masako Hinatsu, Chiba (JP); Akinori Okada, Osaka (JP); Yasuyuki Agari, Osaka (JP); Hiroshi Hirano, Osaka (JP); Joji Kadota, Osaka (JP)

(73) Assignees: JNC CORPORATION, Tokyo (JP); Osaka Research Institute of Industrial Science and Technology, Osaka-Fu (JP)

( * ) Notice: Subject to any disclaimer, the term of this patent is extended or adjusted under 35 U.S.C. 154(b) by 0 days.

(21) Appl. No.: 15/506,252

(22) PCT Filed: Aug. 26, 2015

(86) PCT No.: PCT/JP2015/074128
§ 371 (c)(1),
(2) Date: Jul. 13, 2017

(87) PCT Pub. No.: WO2016/031888
PCT Pub. Date: Mar. 3, 2016

(65) Prior Publication Data
US 2017/0306207 A1 Oct. 26, 2017

(30) Foreign Application Priority Data

Aug. 27, 2014 (JP) .................. 2014-173316

(51) Int. Cl.
C08K 9/06 (2006.01)
C08L 101/06 (2006.01)
H01L 21/48 (2006.01)
H01L 23/373 (2006.01)
C09K 5/14 (2006.01)
C08G 59/00 (2006.01)
C08G 65/18 (2006.01)
C08L 101/00 (2006.01)
C08K 3/38 (2006.01)

(52) U.S. Cl.
CPC .............. C09K 5/14 (2013.01); C08G 59/00 (2013.01); C08G 65/18 (2013.01); C08K 3/38 (2013.01); C08K 9/06 (2013.01); C08L 101/00 (2013.01); H01L 21/4871 (2013.01); H01L 23/373 (2013.01); H01L 23/3737 (2013.01); C08K 2003/385 (2013.01); H01L 2924/0002 (2013.01)

(58) Field of Classification Search
USPC ................. 523/209, 213; 524/404, 424, 495
See application file for complete search history.

(56) References Cited

U.S. PATENT DOCUMENTS

| 8,324,313 | B2 * | 12/2012 | Funahashi | C08L 83/04 |
| | | | | 524/588 |
| 2011/0159296 | A1 * | 6/2011 | Maenaka | B32B 15/08 |
| | | | | 428/416 |
| 2012/0286194 | A1 | 11/2012 | Hirano | |
| 2013/0030105 | A1 * | 1/2013 | Shimokoba | C08L 77/00 |
| | | | | 524/404 |
| 2014/0350152 | A1 * | 11/2014 | Backeer | C09C 1/48 |
| | | | | 524/188 |
| 2015/0319854 | A1 | 11/2015 | Kim et al. | |

FOREIGN PATENT DOCUMENTS

| EP | 2786961 | 10/2014 |
| JP | 2003-137627 | 5/2003 |
| JP | 2006-265527 | 10/2006 |
| JP | 2010-116543 | 5/2010 |
| JP | 2011-236376 | 11/2011 |
| JP | 2012-153846 | 8/2012 |
| JP | 2012-255086 | 12/2012 |
| WO | 2009136508 | 11/2009 |
| WO | 2013032238 | 3/2013 |
| WO | 2013081061 | 6/2013 |
| WO | 2013158741 | 10/2013 |
| WO | 2014092400 | 6/2014 |

OTHER PUBLICATIONS

"International Search Report (Form PCT/ISA/210) of PCT/JP2015/074128", dated Nov. 24, 2015, with English translation thereof, pp. 1-4.
"Search Report of European Counterpart Application," dated Jul. 3, 2018, p. 1-p. 8.

* cited by examiner

Primary Examiner — Tae H Yoon
(74) Attorney, Agent, or Firm — JCIPRNET

(57) ABSTRACT

The present invention relates to a composition capable of forming a heat dissipating member having high thermal conductivity and a heat dissipating member. The composition for a heat dissipating member of the present invention is a composition for a heat dissipating member that includes a first inorganic filler having thermal conductivity that is bonded to one end of a coupling agent; a second inorganic filler having thermal conductivity that is bonded to one end of a coupling agent, in which a bifunctional or higher polymerizable compound is additionally bonded to the other end of the bonded coupling agent; wherein the other end of the coupling agent bonded to the first inorganic filler is to be bonded to the polymerizable compound on the second inorganic filler during curing.

14 Claims, 7 Drawing Sheets

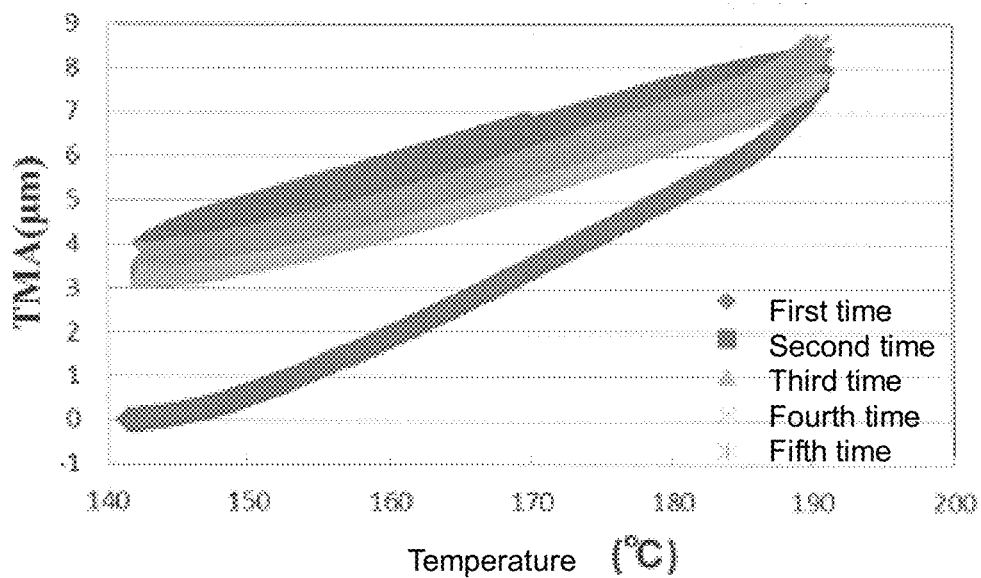
FIG. 4(d)
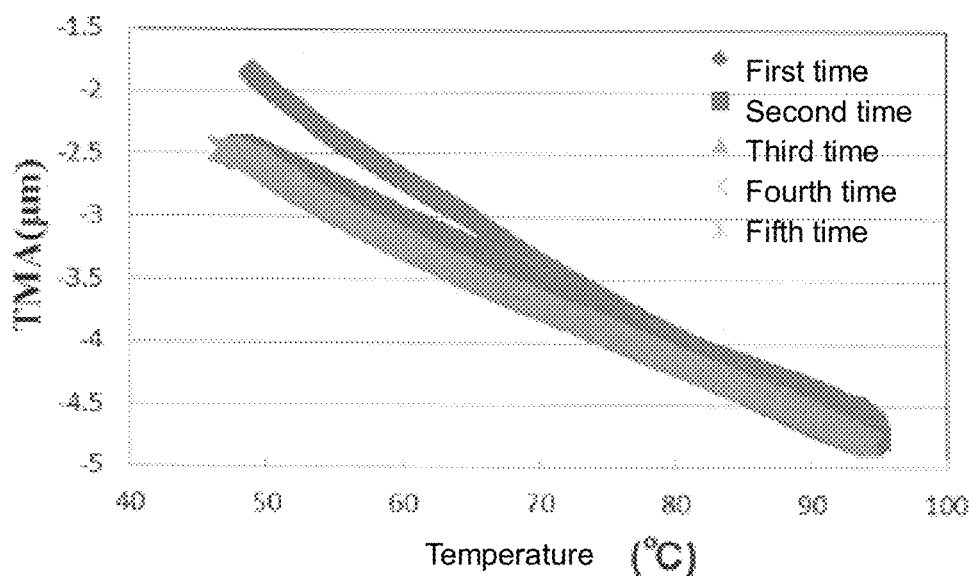
FIG. 4(d')

COMPOSITION FOR HEAT-DISSIPATION MEMBERS, HEAT-DISSIPATION MEMBER, ELECTRONIC DEVICE, AND METHOD OF PRODUCING HEAT DISSIPATING MEMBER

CROSS-REFERENCE TO RELATED APPLICATION

This application is a 371 application of the International PCT application serial no. PCT/JP2015/074128, filed on Aug. 26, 2015, which claims the priority benefits of Japan Patent Application No. 2014-173316, filed on Aug. 27, 2014. The entirety of each of the abovementioned patent applications is hereby incorporated by reference herein and made a part of this specification.

TECHNICAL FIELD

The present invention relates to a composition for a heat dissipating member, and specifically, to a composition for a heat dissipating member capable of forming a heat dissipating member that is able to perform heat dissipation by efficiently conducting and propagating heat generated inside an electronic apparatus and in which a thermal expansion coefficient is able to be controlled.

BACKGROUND ART

In recent years, it has become desirable to increase the thermal conductivity of packaging materials in semiconductor devices for power control of hybrid vehicles, electric vehicles and the like and CPUs for high speed computers so that the temperature of internal semiconductors does not excessively increase. That is, an ability to effectively dissipate heat generated by semiconductor chips to the outside is important. In addition, thermal distortion may occur due to a difference between thermal expansion coefficients of materials used in a package according to an increase in the operating temperature, which results in a problem of a lifespan being reduced due to detachment of wires and the like.

As a method of solving such a heat dissipation problem, a heat dissipation method in which a material having high thermal conductivity (a heat dissipating member) is brought in contact with a heat generating portion to conduct heat to the outside may be exemplified. Examples of a material having high thermal conductivity include inorganic materials such as metals and metal oxides. In particular, use of aluminum nitride is preferred because it has a similar thermal expansion coefficient to that of silicon. However, such inorganic materials have problems of processability and crackability and it is difficult for such inorganic materials to have satisfactory characteristics as substrate materials in a package. Therefore, the development of a heat dissipating member having high thermal conductivity obtained by combining such an inorganic material and a resin has been conducted.

In order to increase the thermal conductivity of a resin composite material, in general, a large amount of a metal filler or an inorganic filler has been added to a commodity resin such as a silicone resin, a polyamide resin, a polystyrene resin, an acryl resin, and an epoxy resin. However, the thermal conductivity of the inorganic filler is a value specific to a substance and an upper limit thereof is fixed. Therefore, there have been many attempts regarding methods of improving thermal conductivity of a resin and thermal conductivity of a composite material from the bottom up.

In Patent Literature 1, as a method of improving thermal conductivity of a resin, a heat dissipating member obtained by performing orientation control on a liquid crystal composition using an orientation control additive and a rubbing treatment method and performing polymerization is disclosed.

CITATION LIST

Patent Literature

[Patent Literature 1]
Japanese Patent Application Publication No. 2006-265527

SUMMARY OF INVENTION

Technical Problem

As described above, it is desirable for a heat dissipating member are required to have more effective high thermal conductivity and controllability of thermal expansion coefficient along with the development of electronic apparatuses.

Therefore, the present invention provides a composition capable of forming a heat dissipating member that has high thermal conductivity and in which a thermal expansion coefficient can be controlled and a heat dissipating member.

Solution to Problem

The inventors found that, in combining organic materials and inorganic materials, when inorganic materials are bonded to each other, that is, inorganic materials are directly bonded through a coupling agent and a bifunctional or higher reactive organic compound (refer to FIGS. 1 and 2), or inorganic materials are directly bonded through a coupling agent (refer to FIGS. 1 and 3) instead of adding an inorganic material to a resin, it is possible to obtain a composite material having extremely high thermal conductivity and in which a thermal expansion coefficient is able to be controlled, and completed the present invention.

A composition for a heat dissipating member according to a first aspect of the present invention is, for example, as shown in FIG. 2, a composition for a heat dissipating member that includes a first inorganic filler 1 having thermal conductivity that is bonded to one end of a coupling agent 3 and a second inorganic filler 2 having thermal conductivity that is bonded to one end of a coupling agent 4 in which a bifunctional or higher polymerizable compound 5 is additionally bonded to the other end of the bonded coupling agent 4, wherein the other end of the coupling agent 3 bonded to the first inorganic filler 1 is to be bonded to the polymerizable compound 5 on the second inorganic filler 2 during curing. "One end" and "the other end" may be an edge or an end of a shape of a molecule and may or may not be both ends of a long side of a molecule.

In such a configuration, it is possible to form the heat dissipating member by inorganic fillers being directly bonded to each other through coupling agents and a polymerizable compound. Therefore, it is possible to directly propagate the phonon that is a main element for heat conduction, and the cured heat dissipating member can have extremely high thermal conductivity not only in the horizontal direction but also in the thickness direction.

A composition for a heat dissipating member according to a second aspect of the present invention includes, for example, as shown in FIG. 3, a first inorganic filler 1 having thermal conductivity that is bonded to one end of a coupling agent 3; and a second inorganic filler 2 having thermal conductivity that is bonded to one end of a coupling agent 4; wherein the coupling agent bonded to the first inorganic filler and the coupling agent bonded to the second inorganic filler each have a functional group for bonding coupling agents, wherein the other end of the coupling agent 3 bonded to the first inorganic filler 1 is bonded to the other end of the coupling agent 4 bonded to the second inorganic filler 2 by curing.

In such a configuration, it is possible to form the heat dissipating member by inorganic fillers being directly bonded to each other through coupling agents. Therefore, it is possible to directly propagate the phonon that is a main element for heat conduction, and the cured heat dissipating member can have extremely high thermal conductivity not only in the horizontal direction but also in the thickness direction.

According to a composition for a heat dissipating member according to a third aspect of the present invention, the first inorganic filler and the second inorganic filler are a nitride or a carbon material in the composition for a heat dissipating member according to the first aspect or the second aspect of the present invention.

In such a configuration, the composition for a heat dissipating member can contain a more preferable compound as an inorganic filler.

According to a composition for a heat dissipating member according to a fourth aspect of the present invention, the first inorganic filler and the second inorganic filler are at least one selected from boron nitride, boron carbide, boron nitride carbon, graphite, a carbon fiber, and a carbon nanotube in the composition for a heat dissipating member according to the third aspect of the present invention.

In such a configuration, a target composition for a heat dissipating member is obtained by combining inorganic fillers having high thermal conductivity and a very small or negative thermal expansion coefficient.

A composition for a heat dissipating member according to a fifth aspect of the present invention further includes a third inorganic filler that has a different thermal expansion coefficient from those of the first inorganic filler and the second inorganic filler, wherein the third inorganic filler has thermal conductivity and is bonded to one end of a coupling agent, or the third inorganic filler has thermal conductivity and is bonded to one end of a coupling agent to which the polymerizable compound is bonded in the composition for a heat dissipating member according to any one of the first aspect to the fourth aspect of the present invention.

In such a configuration, when the first inorganic filler and the second inorganic filler have a two dimensional plate shape or a one-dimensional linear shape, if only these are combined, the physical property of combined composition for a heat dissipating member also has large anisotropy. When the third filler is added, orientations of the first and second inorganic fillers are relaxed and the anisotropy decreases, which is advantageous. In addition, when the thermal expansion coefficient of the first and second inorganic fillers is very small or negative, by adding the third inorganic filler having a positive thermal expansion coefficient, it is possible to accurately change the thermal expansion coefficient from negative to positive according to the mixing ratio. The inorganic filler used as the third inorganic filler is not limited but a material having high thermal conductivity is desirable.

A composition for a heat dissipating member according to a sixth aspect of the present invention further includes an organic compound or a polymer compound that is not bonded to the first inorganic filler and the second inorganic filler in the composition for a heat dissipating member according to any one of the first aspect to fifth aspect of the present invention.

In such a configuration, in the composition for a heat dissipating member obtained by directly connecting and curing the first and second inorganic fillers, as a particle size of a filler is increased in order to improve thermal conductivity, the porosity accordingly increases. When voids are filled with a compound that is not bonded thereto, it is possible to improve thermal conductivity and water vapor blocking performance.

According to a composition for a heat dissipating member according to a seventh aspect of the present invention, the bifunctional or higher polymerizable compound is a polymerizable compound having a structure having an oxiranyl group or oxetanyl group at both ends in the composition for a heat dissipating member according to the first aspect of the present invention.

In such a configuration, it is possible to bond a silane coupling agent and organic molecules with favorable heat resistance and high thermal conductivity. Further, when heat resistance is particularly important, it can be appropriately selected, for example, a case in which a structure having high heat resistance such as an imide bond and an amide bond is favorable even if thermal conductivity slightly.

According to a composition for a heat dissipating member according to an eighth aspect of the present invention, the bifunctional or higher polymerizable compound is at least one polymerizable liquid crystal compound represented by the following Formula (1-1) in the composition for a heat dissipating member according to the seventh aspect of the present invention.

$$R^{a1}-Z-(A-Z)_{m1}-R^{a1} \quad (1\text{-}1)$$

[in Formula (1-1), $R^{a1}$ is a polymerizable group represented by any one of the following Formulae (2-1) and (2-2);

A is 1,4-cyclohexylene, 1,4-cyclohexenylene, 1,4-phenylene, naphthalene-2,6-diyl, tetrahydronaphthalene-2,6-diyl, fluorene-2,7-diyl, bicyclo[2.2.2]oct-1,4-diyl, or bicyclo[3.1.0]hex-3,6-diyl, in the rings, any —$CH_2$— may be replaced with —O—, any —CH═ may be replaced with —N═, and any hydrogen may be replaced with a halogen, an alkyl group having 1 to 10 carbon atoms, or an alkyl halide having 1 to 10 carbon atoms, in the alkyl, any —$CH_2$— may be replaced with —O—, —CO—, —COO—, —OCO—, —CH═CH—, or Z independently represents a single bond or an alkylene group having 1 to 20 carbon atoms, in the alkylene, any —$CH_2$— may be replaced with —O—, —S—, —CO—, —COO—, —OCO—, —CH═CH—, —CF═CF—, —CH═N—, —N═CH—, —N(O)═N—, or —C≡C—, and any hydrogen may be replaced with a halogen; and m1 is an integer of 1 to 6]

[Chem. 1]

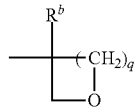

(2-1)

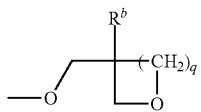

(2-2)

[in Formulae (2-1) and (2-2), $R^b$ is hydrogen, a halogen, —$CF_3$, or an alkyl group having 1 to 5 carbon atoms, and q is 0 or 1]

In such a configuration, the composition for a heat dissipating member can contain a polymerizable liquid crystal compound as a polymerizable compound. These compounds have a thermosetting property, can be cured without being affected by an amount of a filler, and also have excellent heat resistance. In addition, since the molecular structure has symmetry and linearity, it is considered to be advantageous in conduction of the phonon.

In a composition for a heat dissipating member according to a ninth aspect of the present invention, in Formula (1-1), A represents 1,4-cyclohexylene, 1,4-cyclohexylene in which any hydrogen is replaced with a halogen, 1,4-phenylene, 1,4-phenylene in which any hydrogen is replaced with a halogen or a methyl group, fluorene-2,7-diyl, or fluorene-2,7-diyl in which any hydrogen is replaced with a halogen or a methyl group in the composition for a heat dissipating member according to the eighth aspect of the present invention.

In such a configuration, the composition for a heat dissipating member can contain a more preferable compound as a polymerizable liquid crystal compound. These compounds have higher molecular linearity and are considered to be more advantageous in conduction of the phonon.

In a composition for a heat dissipating member according to a tenth aspect of the present invention, in Formula (1-1), Z represents a single bond, —$(CH_2)_a$—, —$O(CH_2)_a$—, —$(CH_2)_aO$—, —$O(CH_2)_aO$—, —CH═CH—, —C≡C—, —COO—, —OCO—, —CH═CH—COO—, —OCO—CH═CH—, —$CH_2CH_2$—COO—, —OCO—$CH_2CH_2$—, —CH═N—, —N═CH—, —N═N—, —$OCF_2$— or —$CF_2O$—, and a is an integer of 1 to 20 in the composition for a heat dissipating member according to the eighth aspect or the ninth aspect of the present invention.

In such a configuration, the composition for a heat dissipating member can contain a particularly preferable compound as a polymerizable liquid crystal compound. These compounds are preferable because they are excellent in terms of physical properties, ease of preparation, or ease of handling.

A heat dissipating member according to an eleventh aspect of the present invention is obtained by curing the composition for a heat dissipating member according to any one of the first aspect to the tenth aspect of the present invention.

In such a configuration, the heat dissipating member has a bond between inorganic fillers and can have extremely high thermal conductivity.

An electronic apparatus according to a twelfth aspect of the present invention is an electronic apparatus including the heat dissipating member according to the eleventh aspect of the present invention; and an electronic device having a heating unit; wherein the heat dissipating member is disposed in the electronic device in contact with the heating unit.

In such a configuration, according to the heat dissipating member having high thermal conductivity, it is possible to efficiently conduct heat generated in the electronic device. In addition, when a thermal expansion coefficient in the planar direction is set to be close to a thermal expansion coefficient of a copper wiring attached to the heat dissipating member or a semiconductor device such as silicon and silicon nitride, a device in which detachment due to a heat cycle is difficult can be prepared.

A method of producing a heat dissipating member according to a thirteenth aspect of the present invention includes a process in which a first inorganic filler having thermal conductivity is bonded to one end of a coupling agent; a process in which a second inorganic filler having thermal conductivity is bonded to one end of a coupling agent; a process in which the other end of the coupling agent bonded to the second inorganic filler is bonded to a bifunctional or higher polymerizable compound; and a process in which the other end of the coupling agent bonded to the first inorganic filler is bonded to the bifunctional or higher polymerizable compound on the second inorganic filler.

In such a configuration, inorganic fillers are directly bonded through the coupling agent and the polymerizable compound, so that a method for producing a heat dissipating member including such kind of fillers is provided.

A method of producing a heat dissipating member according to a fourteenth aspect of the present invention includes a process in which a first inorganic filler having thermal conductivity is bonded to one end of a coupling agent; a process in which a second inorganic filler having thermal conductivity is bonded to one end of a coupling agent; and a process in which the other end of the coupling agent bonded to the first inorganic filler is bonded to the other end of the coupling agent bonded to the second inorganic filler.

In such a configuration, inorganic fillers are directly bonded through the coupling agent, so that a method for producing a heat dissipating member including such kind of the fillers is provided.

Advantageous Effects of Invention

The heat dissipating member formed of the composition for a heat dissipating member of the present invention has extremely high thermal conductivity and a thermal expansion coefficient which can be controlled. Additionally, characteristics such as excellent chemical stability, heat resistance, hardness and mechanical strength are also provided. The heat dissipating member is appropriate for, for example, a heat dissipation substrate, a heat sink (a planar heat sink), a heat dissipation sheet, a heat dissipation coating film, and a heat dissipation adhesive.

BRIEF DESCRIPTION OF DRAWINGS

FIGS. 4(a) to 4(d) and 4(d') respectively shows the measured results of thermal expansion coefficients of the samples of Examples 1, 2, and 4, and Comparative Example 1.

DESCRIPTION OF EMBODIMENTS

Figure 1:
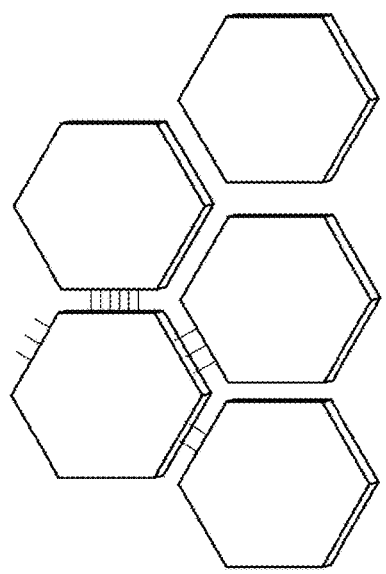
FIG. 1 is a conceptual diagram showing bonding between inorganic fillers using boron nitride as an example in a heat dissipating member of the present invention.

Priority is claimed on Japanese Patent Application No. 2014-173316, filed Aug. 27, 2014, the content of which is incorporated herein by reference. The present invention can be more completely understood from the following detailed description. Wider application ranges of the present invention will be clearly understood from the following detailed description. However, the detailed description and specific examples are only preferred embodiments of the present invention and are described only for the purpose of explanation. Based on the detailed description, it can be clearly understood by those skilled in the art that various modifications and alternations are within the spirit and scope of the present invention. The applicants do not intend to present all of the described embodiments and modifications and alternations that may not be included in the scope of the claims are parts of the invention under the doctrine of equivalents.

Embodiments of the present invention will be described below with reference to the accompanying drawings. Moreover, in the drawings, the same or corresponding parts are denoted by the same or similar reference numerals and redundant descriptions thereof will be omitted. In addition, the present invention is not limited to the following embodiments.

Terms in this specification are used as follows.

A "liquid crystal compound" and a "liquid crystalline compound" refer to a compound that exhibits a liquid crystal phase such as a nematic phase or a smectic phase.

The meaning of an expression such as "any $—CH_2—$ in an alkyl may be replaced with $—O—$" or "any $—CH_2CH_2—$ may be replaced with $—CH=CH—$" will be described in an example below. For example, a group in which any $—CH_2—$ in $C_4H_9—$ is replaced with $—O—$ or $—CH=CH—$ includes $C_3H_7O—$, $CH_3—O—(CH_2)_2—$, and $CH_3—O—CH_2—O—$. Similarly, a group in which any $—CH_2CH_2—$ in $C_5H_{11}—$ is replaced with $—CH=CH—$ includes $H_2C=CH—(CH_2)_3—$, and $CH_3—CH=CH—(CH_2)_2—$. Moreover, a group in which any $—CH_2—$ is replaced with $O—$ includes $CH_3—CH=CH—CH_2—O—$. In this manner, the term "any" means "at least one selected without distinction." Moreover, in consideration of stability of a compound, $CH_3—O—CH_2—O—$ in which oxygen and oxygen are not adjacent to each other is more preferable than $CH_3—O—O—CH_2—$ in which oxygen and oxygen are adjacent to each other.

In addition, the expression "any hydrogen may be replaced with a halogen, an alkyl group having 1 to 10 carbon atoms, or an alkyl halide having 1 to 10 carbon atoms" in a ring A indicates a form in which, for example, at least one hydrogen at the 2, 3, 5, and 6 positions in 1,4-phenylene is replaced with a substituent such as fluorine or a methyl group, and includes an example such as a 2-fluoroethyl group or a 3-fluoro-5-chlorohexyl group as a form in which a substituent is an "alkyl halide having 1 to 10 carbon atoms."

A "compound (1-1)" refers to a liquid crystal compound represented by the following Formula (1-1) to be described below and also refers to at least one compound represented by the following Formula (1-1). A "composition for a heat dissipating member" refers to a composition containing at least one compound selected from among the compound (1-1) and other polymerizable compounds. When one compound (1-1) includes a plurality of A's, any two A's may be the same as or different from each other. When a plurality of compounds (1-1) include A, any two A's may be the same as or different from each other. This rule similarly applies to other symbols and groups such as $R^{a1}$ and Z.

[Composition for a Heat Dissipating Member]

The composition for a heat dissipating member of the present invention is a composition that can form a heat dissipating member by inorganic fillers being directly bonded to each other through a coupling agent and a bifunctional or higher polymerizable compound by curing. FIG. 1 shows an example in which boron nitride is used as an inorganic filler. When boron nitride (h-BN) is treated with a coupling agent, since there are no reactive groups on planar surfaces of particles in the case of boron nitride, the coupling agent bonds to only their circumferences. Boron nitride treated with a coupling agent can form bonds with a polymerizable compound. Therefore, when the other end of a coupling agent of coupled boron nitride and the other end of a polymerizable compound of boron nitride that is subjected to a coupling treatment and additionally modified with a polymerizable compound are bonded (refer to FIG. 2), boron nitride particles are bonded to each other as shown in FIG. 1.

In this manner, when inorganic fillers are bonded to each other through coupling agents and a polymerizable compound, since it is possible to directly propagate the phonon, the cured heat dissipating member has extremely high thermal conductivity and it is possible to prepare a composite material directly reflecting a thermal expansion coefficient of an inorganic component.

Figure 2:
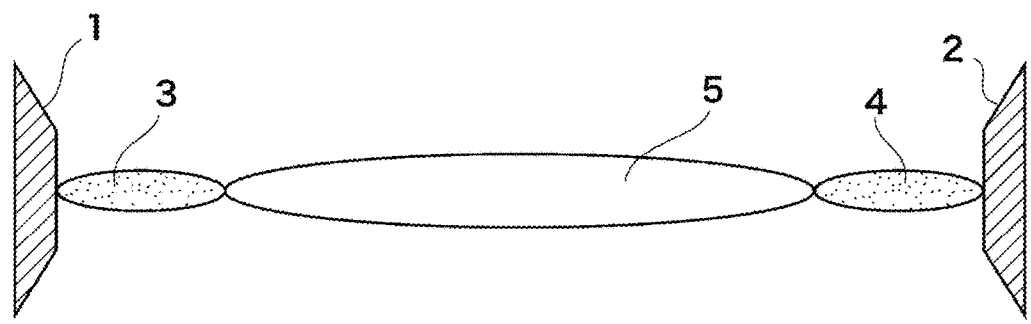
FIG. 2 is a conceptual diagram showing a state in which, the other end of a coupling agent 3 bonded to a first inorganic filler 1 is bonded to a polymerizable compound 5 on a second inorganic filler 2 by curing a composition for a heat dissipating member.

A composition for a heat dissipating member according to a first embodiment of the present invention, for example, as shown in FIG. 2, includes a first inorganic filler 1 having thermal conductivity that is bonded to one end of a coupling agent 3 and a second inorganic filler 2 having thermal conductivity that is bonded to one end of a coupling agent 4, wherein a bifunctional or higher polymerizable compound 5 is additionally bonded to the other end of the bonded coupling agent 4.

As shown in FIG. 2, when the composition for a heat dissipating member of the present invention is cured, the other end of the coupling agent 3 bonded to the first inorganic filler 1 is bonded to the polymerizable compound 5 on the second inorganic filler 2. In this manner, a bond between inorganic fillers is formed. Note that it is important for the present invention to form a bond between such inorganic fillers and a silane coupling agent and a polymerizable compound may be reacted in advance using an organic synthesis technique before being bonded to inorganic fillers.

<Bifunctional or Higher Polymerizable Compound>

A polymerizable liquid crystal compound is preferably used as a bifunctional or higher polymerizable compound.

As the polymerizable liquid crystal compound, a liquid crystal compound represented by the following Formula (1-1) is preferable, which includes a liquid crystal skeleton and a polymerizable group, and has high polymerization reactivity, a wide liquid crystal phase temperature range, and favorable miscibility. When the compound (1-1) is mixed with another liquid crystalline compound or polymerizable compound, the resultant readily becomes uniform.

$$R^{a1}-Z-(A-Z)_{m1}-R^{a1} \quad (1-1)$$

When a terminal group $R^{a1}$, a ring structure A and a binding group Z of the compound (1-1) are appropriately selected, it is possible to arbitrarily adjust physical properties such as a liquid crystal phase expression region. Effects of types of the terminal group $R^{a1}$, the ring structure A and the binding group Z on physical properties of the compound (1-1) and preferable examples thereof will be described below.

Terminal Group $R^{a1}$

When $R^{a1}$ of the above compound (1-1) is a linear alkyl, a temperature range of a liquid crystal phase is wide and viscosity is low. On the other hand, when $R^{at}$ is a branched alkyl, compatibility with another liquid crystalline compound is favorable. Even if $R^{a1}$ is a cyano group, a halogen, —$CF_3$, or —$OCF_3$, a temperature range of a liquid crystal phase is favorable, dielectric anisotropy is high and compatibility is appropriate.

As a preferable $R^{a1}$, hydrogen, fluorine, chlorine, a cyano group, —N=C=O, —N=C=S, an alkyl group, an alkoxy group, an alkoxyalkyl group, an alkoxyalkoxy group, an alkylthio group, an alkylthioalkoxy group, an alkenyl group, an alkenyloxy group, an alkenyloxyalkyl group, an alkoxyalkenyl group, an alkynyl group, and an alkynyloxy group may be exemplified. Among these groups, a group in which at least one hydrogen is replaced with a halogen is preferable. A halogen is preferably fluorine or chlorine and more preferably fluorine. Specific examples include monofluoroalkyl, polyfluoroalkyl, perfluoroalkyl, monofluoroalkoxy, polyfluoroalkoxy, and perfluoroalkoxy. Among these groups, a linear group is more preferable than a branched group in consideration of ease of conduction of the phonon, that is, ease of transfer of heat.

As a more preferable $R^{a1}$, hydrogen, fluorine, chlorine, a cyano group, —$CF_3$, —$CF_2H$, —$CFH_2$, —$OCF_3$, —$OCF_2H$, an alkyl group having 1 to 10 carbon atoms, an alkoxy having 1 to 10 carbon atoms, and an alkoxyalkyl group having 2 to 10 carbon atoms may be exemplified. As the alkyl, alkoxy, and alkoxyalkyl, for example, methyl, ethyl, propyl, butyl, pentyl, hexyl, heptyl, octyl, nonyl, decyl, methoxy, ethoxy, propyloxy, butyloxy, pentyloxy, hexyloxy, heptyloxy, octyloxy, nonyloxy, decyloxy, methoxymethyl, and methoxyethyl may be exemplified. As a particularly preferable $R^{a1}$, an alkyl group having 1 to 10 carbon atoms and an alkoxy having 1 to 10 carbon atoms may be exemplified.

Ring Structure A

When at least one ring in the ring structure A of the above compound (1-1) is 1,4-phenylene, an orientational order parameter and magnetization anisotropy are high. In addition, when at least two rings are 1,4-phenylene, a temperature range of a liquid crystal phase is wide and a clearing point is also high. When at least one hydrogen in the 1,4-phenylene ring is replaced with a cyano group, a halogen, —$CF_3$ or —$OCF_3$, dielectric anisotropy is high. In addition, when at least two rings are 1,4-cyclohexylene, a clearing point is high and viscosity is low.

As a preferable A, 1,4-cyclohexylene, 1,4-cyclohexenylene, 2,2-difluoro-1,4-cyclohexylene, 1,3-dioxane-2,5-diyl, 1,4-phenylene, 2-fluoro-1,4-phenylene, 2,3-difluoro-1,4-phenylene, 2,5-difluoro-1,4-phenylene, 2,6-difluoro-1,4-phenylene, 2,3,5-trifluoro-1,4-phenylene, pyridine-2,5-diyl, 3-fluoropyridine-2,5-diyl, pyrimidine-2,5-diyl, pyridazine-3,6-diyl, naphthalene-2,6-diyl, tetrahydronaphthalene-2,6-diyl, fluorene-2,7-diyl, 9-methylfluorene-2,7-diyl, 9,9-dimethylfluorene-2,7-diyl, 9-ethylfluorene-2,7-diyl, 9-fluorofluorene-2,7-diyl, and 9,9-difluorofluorene-2,7-diyl may be exemplified.

As a steric configuration of 1,4-cyclohexylene and 1,3-dioxane-2,5-diyl, a trans configuration is more preferable than a cis configuration. Since 2-fluoro-1,4-phenylene and 3-fluoro-1,4-phenylene are structurally identical, the latter will not be exemplified. This rule similarly applies to a relationship between 2,5-difluoro-1,4-phenylene and 3,6-difluoro-1,4-phenylene.

As a more preferable A, 1,4-cyclohexylene, 1,4-cyclohexenylene, 1,3-dioxane-2,5-diyl, 1,4-phenylene, 2-fluoro-1,4-phenylene, 2,3-difluoro-1,4-phenylene, 2,5-difluoro-1,4-phenylene, and 2,6-difluoro-1,4-phenylene may be exemplified. As a particularly preferable A, 1,4-cyclohexylene and 1,4-phenylene may be exemplified.

Binding Group Z

When the binding group Z of the above compound (1-1) represents a single bond, —$(CH_2)_2$—, —$CH_2O$—, —$OCH_2$—, —$CF_2O$—, —$OCF_2$—, —CH=CH—, —CF=CF— or —$(CH_2)_4$—, and particularly when it represents a single bond, —$(CH_2)_2$—, —$CF_2O$—, —$OCF_2$—, —CH=CH— or —$(CH_2)_4$—, viscosity decreases. In addition, when the binding group Z is —CH=CH—, —CH=N—, —N=CH—, —N=N— or —CF=CF—, a temperature range of a liquid crystal phase is wide. In addition, when the binding group Z is an alkyl group having about 4 to 10 carbon atoms, a melting point decreases.

As a preferable Z, a single bond, —$(CH_2)_2$—, —$(CF_2)_2$—, —COO—, —OCO—, —$CH_2O$—, —$OCH_2$—, —$CF_2O$—, —$OCF_2$—, —CH=CH—, —CF=CF—, —C≡C—, —$(CH_2)_4$—, —$(CH_2)_3O$—, —$O(CH_2)_3$—, —$(CH_2)_2COO$—, —$OCO(CH_2)_2$—, —CH=CH—COO—, and —OCO—CH=CH— may be exemplified.

As a more preferable Z, a single bond, —$(CH_2)_2$—, —COO—, —OCO—, —$CH_2O$—, —$OCH_2$—, —$CF_2O$—, —$OCF_2$—, —CH=CH—, and —C≡C— may be exemplified. As a particularly preferable Z, a single bond, —$(CH_2)_2$—, —COO— or —OCO— may be exemplified.

When the above compound (1-1) includes three rings or less, viscosity is low. When the above compound (1-1) includes three rings or more, a clearing point is high. Note that, in this specification, basically, a 6-membered ring and a condensed ring including a 6-membered ring are regarded as a ring. For example, a 3-membered ring, a 4-membered ring, and a 5-membered ring alone are not regarded as a ring. In addition, a condensed ring such as a naphthalene ring or a fluorene ring is regarded as one ring.

The above compound (1-1) may be optically active or optically inactive. When the compound (1-1) is optically active, the compound (1-1) may have an asymmetric carbon atom or may have axial asymmetry. A steric configuration of the asymmetric carbon atom may be R or S. The asymmetric carbon atom may be positioned in either $R^{a1}$ or A. When an asymmetric carbon atom is included, the compound (1-1) has favorable compatibility. When the compound (1-1) has axial asymmetry, an induced torsional force is large. In addition, an optical rotation property is inconsequential.

As described above, when types of the terminal group $R^{a1}$, the ring structure A and the binding group Z, and the number of rings are appropriately selected, it is possible to obtain a compound having desired physical properties.

Compound (1-1)

The compound (1-1) can be represented by the following Formula (1-a) or (1-b).

P—Y-(A-Z)$_m$—R$^a$ (1-a)

P—Y-(A-Z)$_m$—Y—P (1-b)

In Formulae (1-a) and (1-b), A, Z, and R$^a$ have the same meanings as A, Z, and R$^{a1}$ defined in the above Formula (1-1). P denotes a polymerizable group represented by the above Formulae (2-1) and (2-2). Y represents a single bond or an alkylene group having 1 to 20 carbon atoms, and preferably an alkylene group having 1 to 10 carbon atoms. In the alkylene, any —CH$_2$— may be replaced with —O—, —S—, —CO—, —COO—, —OCO— or —CH=CH—. A particularly preferable Y is an alkylene in which —CH$_2$— at one end or both ends of an alkylene group having 1 to 10 carbon atoms is replaced with —O—. m is an integer of 1 to 6, preferably an integer of 2 to 6, and more preferably an integer of 2 to 4.

As preferable examples of the compound (1-1), the following compounds (a-1) to (g-20) may be exemplified.

[Chem. 2]

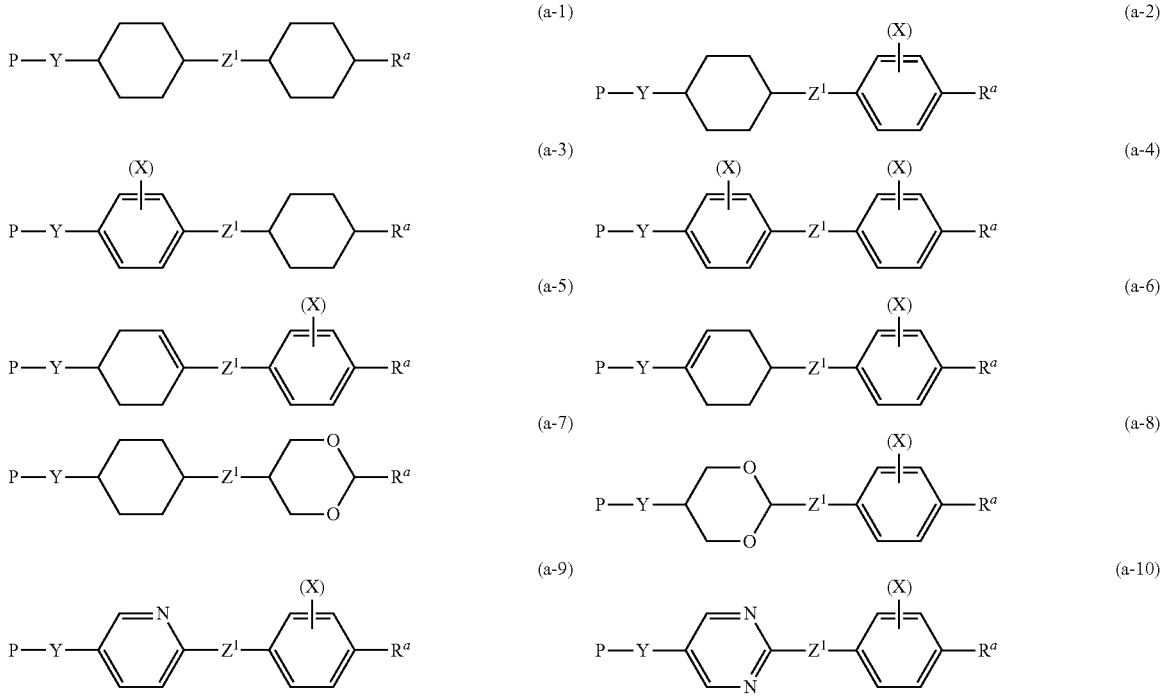

[Chem. 3]

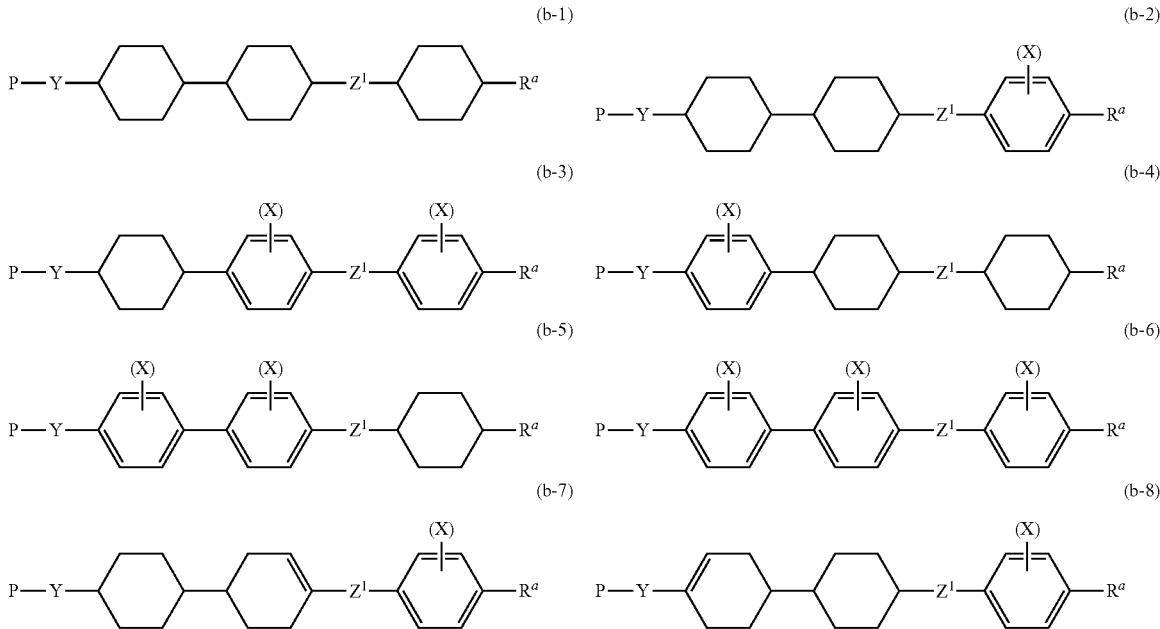

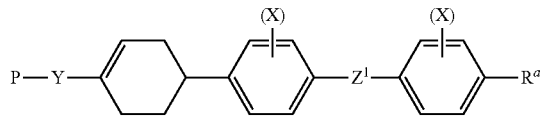
(b-9)
[Chem. 4]
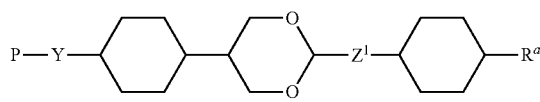 (b-10)
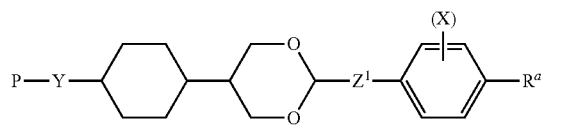 (b-11)
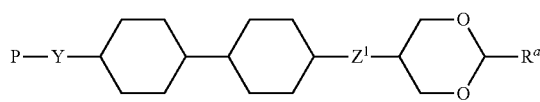 (b-12)
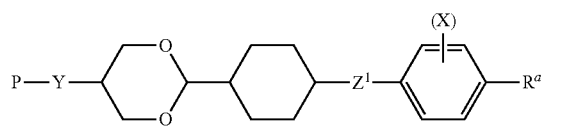 (b-13)
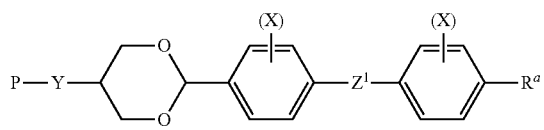 (b-14)
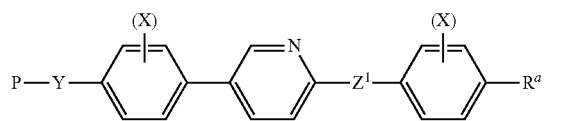 (b-15)
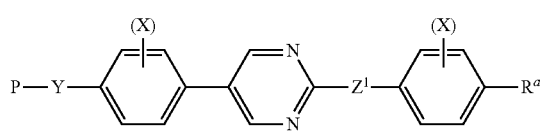 (b-16)
[Chem. 5]
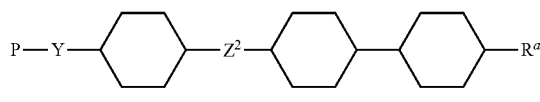 (c-1)
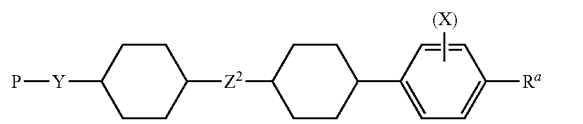 (c-2)
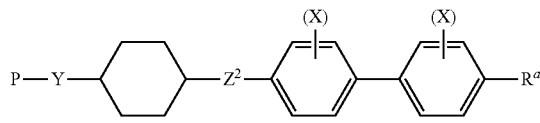 (c-3)
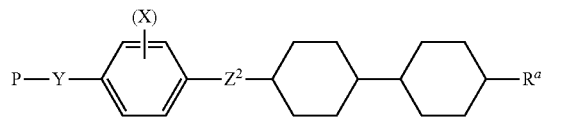 (c-4)
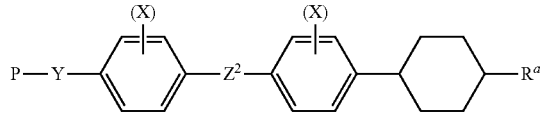 (c-5)
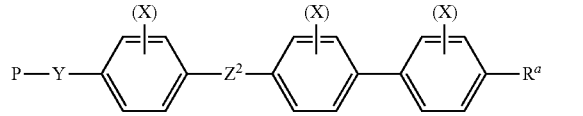 (c-6)
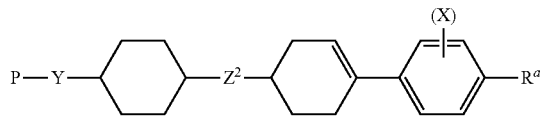 (c-7)
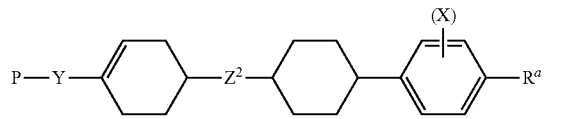 (c-8)
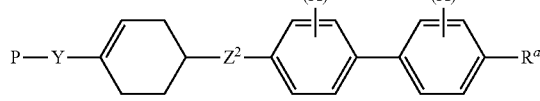 (c-9)

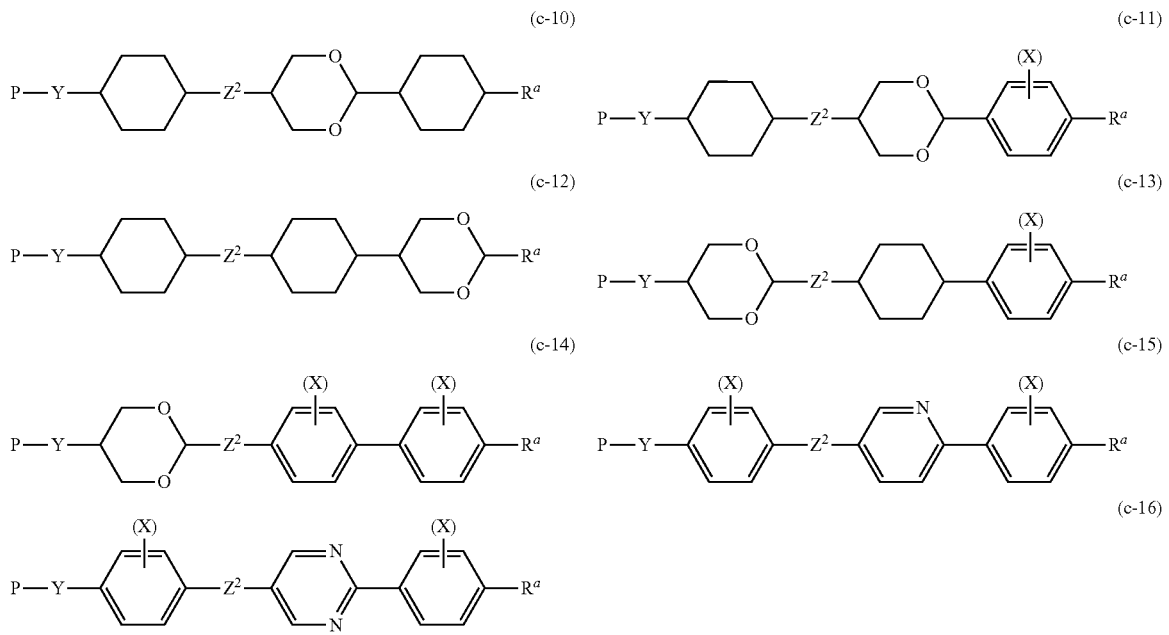
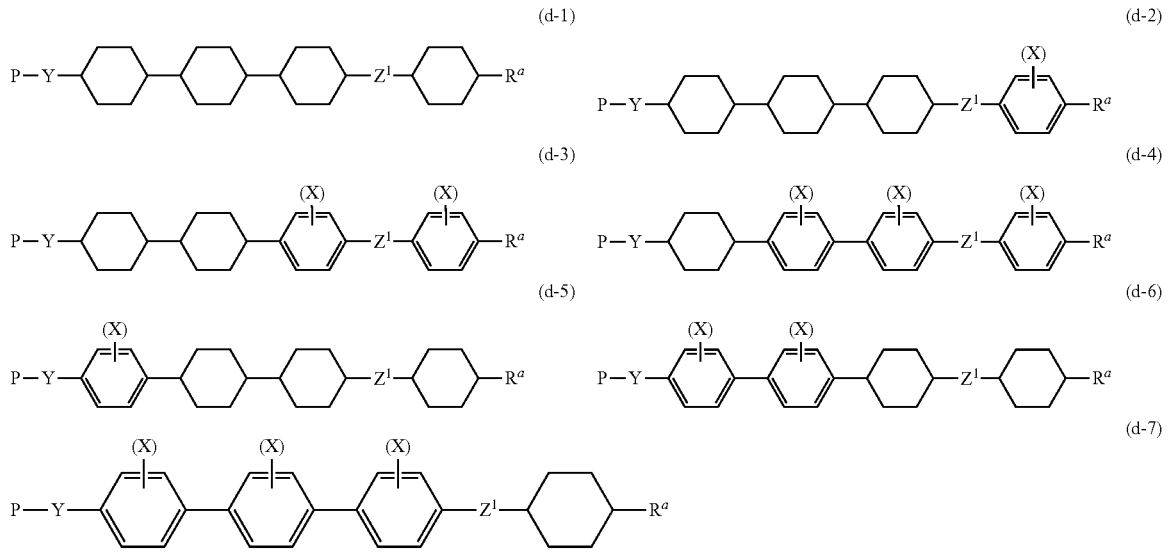
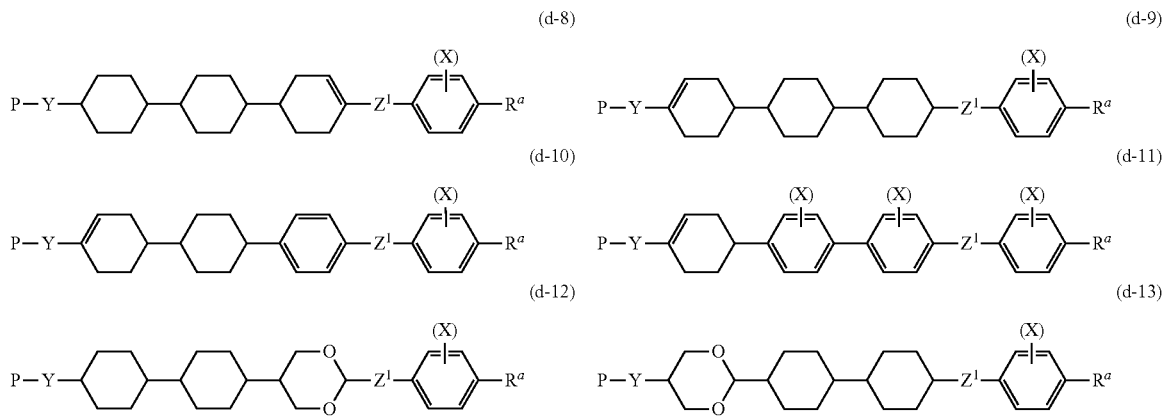

-continued
(d-14) 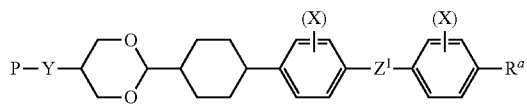
(d-15) 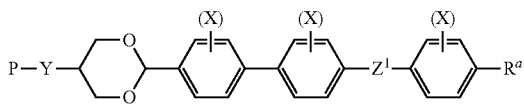
[Chem. 9]
(e-1) 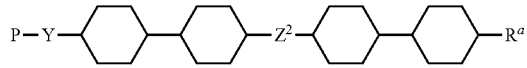
(e-2) 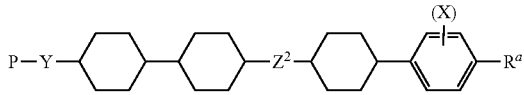
(e-3) 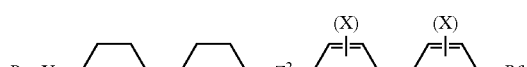
(e-4) 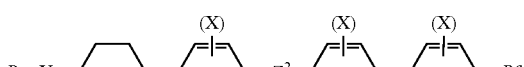
(e-5) 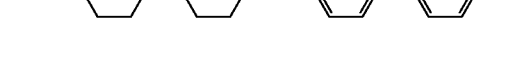
(e-6) 
(e-7) 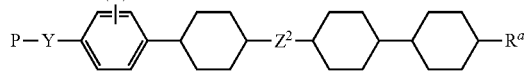
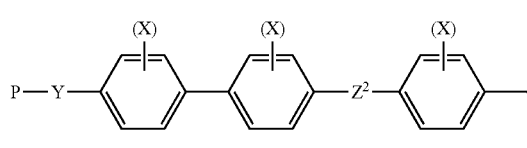
[Chem. 10]
(e-8) 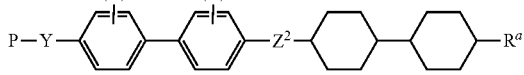
(e-9) 
(e-10) 
(e-11) 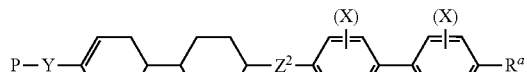
(e-12) 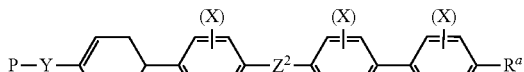
(e-13) 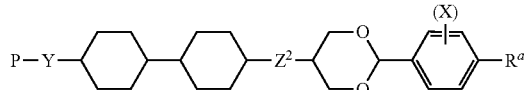
(e-14) 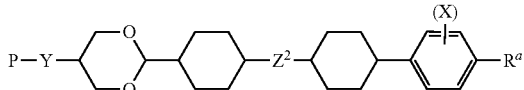
(e-15) 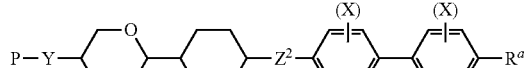
[Chem. 11]
(f-1) 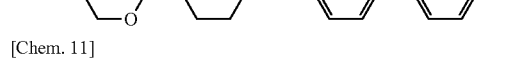
(f-2) 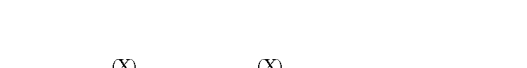
(f-3) 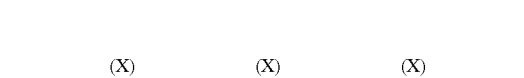
(f-4) 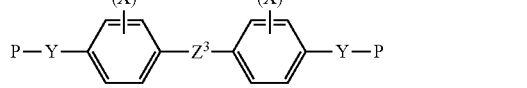
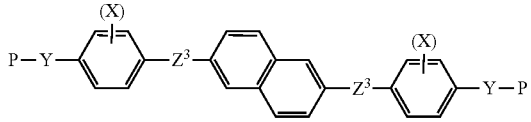

-continued
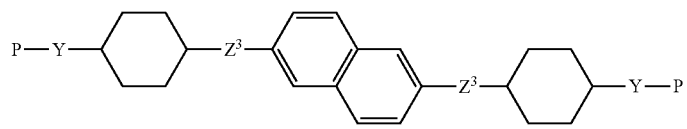
(f-5)
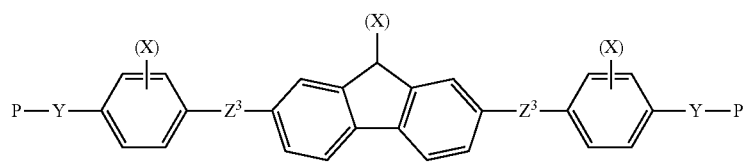
(f-6)
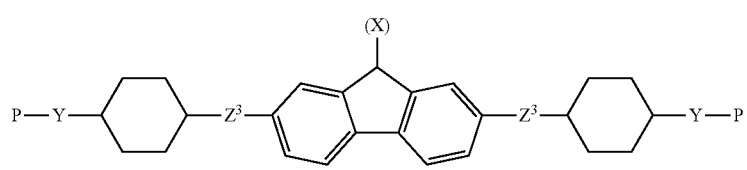
(f-7)
[Chem. 12]
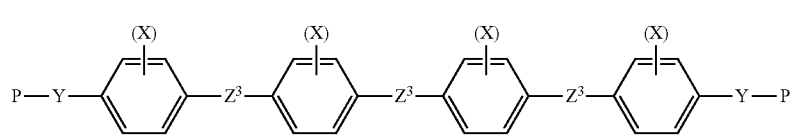
(f-8)
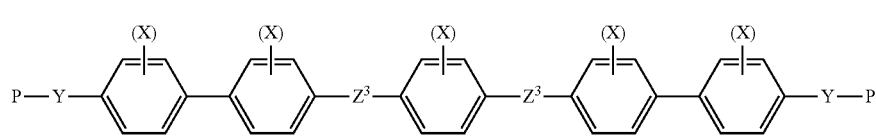
(f-9)
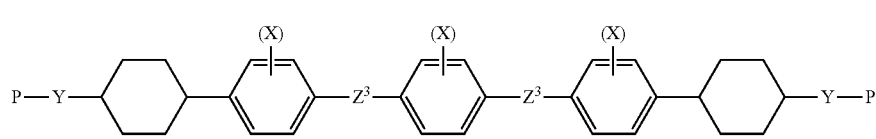
(f-10)
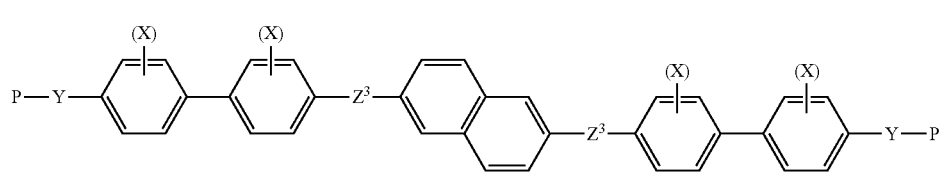
(f-11)
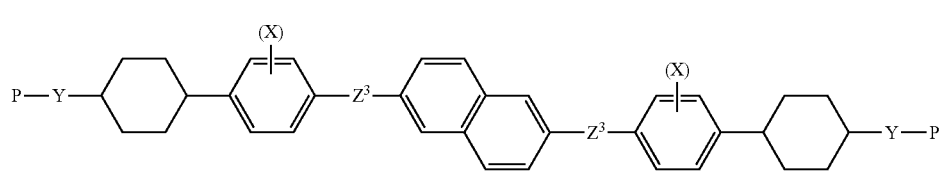
(f-12)
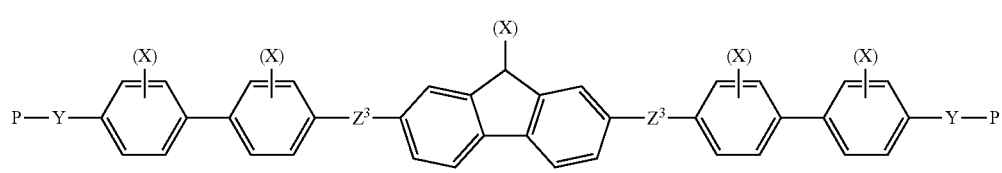
(f-13)
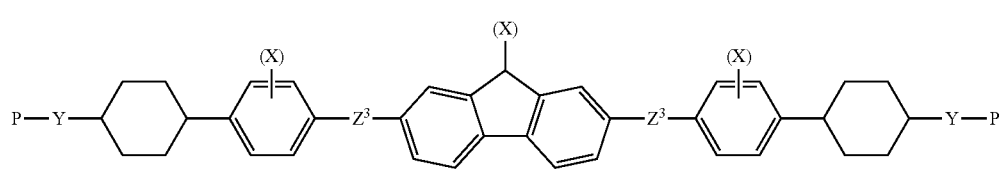
(f-14)

-continued
[Chem. 13]
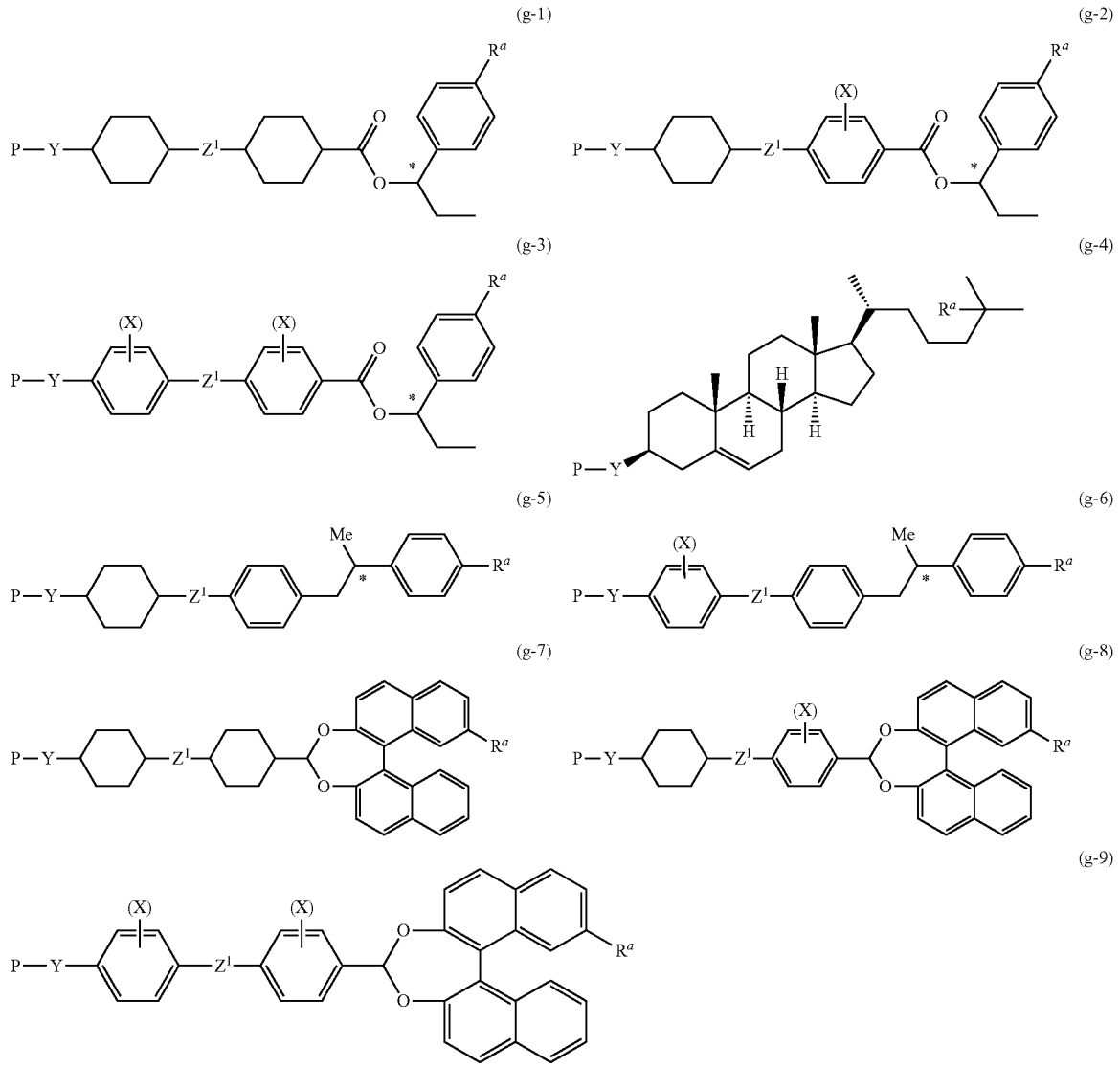
[Chem. 14]
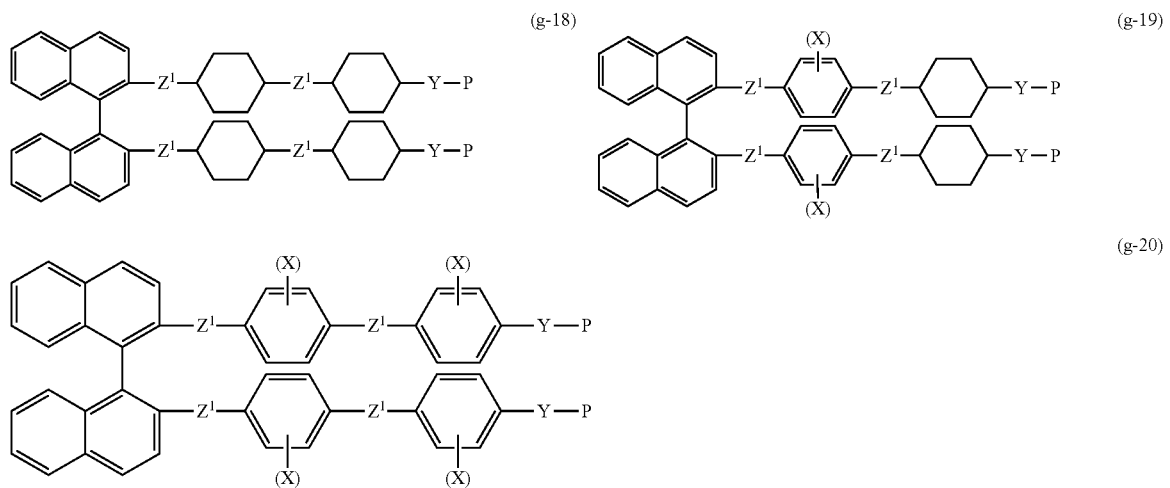

In the above Chemical Formulae (a-1) to (g-20), $R^a$, P and Y are already defined in Formulae (1-a) and (1-b).

$Z^1$ independently represents a single bond, —(CH$_2$)$_2$—, —(CF$_2$)$_2$—, —(CH$_2$)$_4$—, —CH$_2$O—, —OCH$_2$—, —(CH$_2$)$_3$O—, —O(CH$_2$)$_3$—, —COO—, —OCO—, —CH═CH—, —CF═CF—, —CH═CHCOO—, —OCOCH═CH—, —(CH$_2$)$_2$COO—, —OCO(CH$_2$)$_2$—, —C≡C—, —C≡C—COO—, —OCO—C≡C—, —C≡C—CH═CH—, —CH═CH—C≡C—, —CH═N—, —N═CH—, —N═N—, —OCF$_2$— or —CF$_2$O—. Note that a plurality of $Z^1$'s may be the same as or different from each other.

$Z^2$ independently represents —(CH$_2$)$_2$—, —(CF$_2$)$_2$—, —(CH$_2$)$_4$—, —CH$_2$O—, —OCH$_2$—, —(CH$_2$)$_3$O—, —O(CH$_2$)$_3$—, —COO—, —OCO—, —CH═CH—, —CF═CF—, —CH═CHCOO—, —OCOCH═CH—, —(CH$_2$)$_2$COO—, —OCO(CH$_2$)$_2$—, —C≡C—COO—, —OCO—C≡C, —C≡C—CH═CH—, —CH═CH—C≡C—, —CH═N—, —N═CH—, —N═N—, —OCF$_2$— or —CF$_2$O—.

$Z^3$ independently represents a single bond, an alkyl group having 1 to 10 carbon atoms, —(CH$_2$)$_a$—, —O(CH$_2$)$_a$O—, —CH$_2$O—, —OCH$_2$—, —O(CH$_2$)$_3$—, —(CH$_2$)$_3$O—, —COO—, —OCO—, —CH═CH—, —CH═CHCOO—, —OCOCH═CH—, —(CH$_2$)$_2$COO—, —OCO(CH$_2$)$_2$—, —CF═CF—, —C≡C—, —CH═N—, —N═CH—, —N═N—, —OCF$_2$— or —CF$_2$O—. A plurality of $Z^3$'s may be the same as or different from each other. a is an integer of 1 to 20.

X is a substituent of 1,4-phenylene and fluorene-2,7-diyl in which any hydrogen may be replaced with a halogen, an alkyl, and an alkyl fluoride and represents a halogen, an alkyl or an alkyl fluoride.

A more preferable form of the above compound (1-1) will be described. A more preferable compound (1-1) can be represented by the following Formula (1-c) or (1-d).

 (1-c)

 (1-d)

In the above formulae, A, Y, Z, $R^a$ and m are already defined in the above and $P^1$ denotes a polymerizable group represented by the following Formulae (2-1) and (2-2). In Formula (1-d), two $P^1$'s denote the same polymerizable groups (2-1) and (2-2), two Y's denote the same groups, and two Y's are symmetrically bonded.

[Chem. 15]

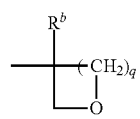

(2-1)

(2-2)

More preferable and specific examples of the above compound (1-1) are as follows.

[Chem. 16]

| | Y | —(A—Z)m— |
|---|---|---|
| (f-1-1) | single bond, (CH$_2$)$_2$, (CH$_2$)$_6$, (CH$_2$)$_4$O, (CH$_2$)$_5$O |  |
| (f-1-2) | single bond, (CH$_2$)$_3$, (CH$_2$)$_5$, (CH$_2$)$_3$O, (CH$_2$)$_6$O | 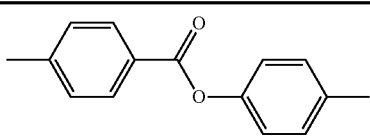 |
| (f-1-3) | single bond, (CH$_2$)$_2$, (CH$_2$)$_6$, (CH$_2$)$_4$O, (CH$_2$)$_6$O | 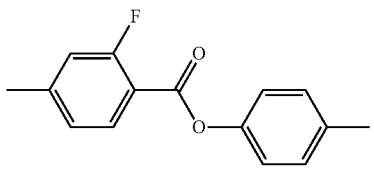 |
| (f-2-1) | single bond, (CH$_2$)$_3$, (CH$_2$)$_4$, (CH$_2$)$_3$O, (CH$_2$)$_6$O | 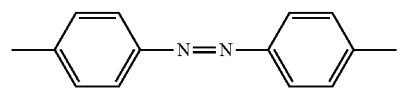 |
| (f-2-2) | single bond, (CH$_2$)$_4$, (CH$_2$)$_5$, (CH$_2$)$_4$O, (CH$_2$)$_6$O | 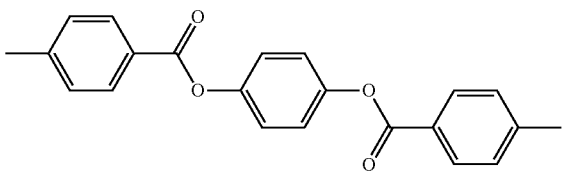 |

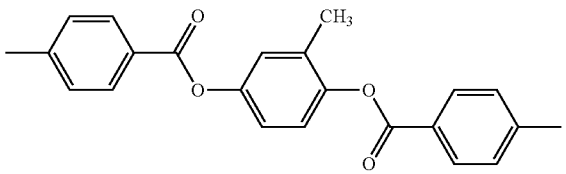

[Chem. 16]
| Y | —(A—Z)m— |
|---|---|
| (f-2-3) single bond, $(CH_2)_2$, $(CH_2)_6$, $(CH_2)_3O$, $(CH_2)_6O$ | 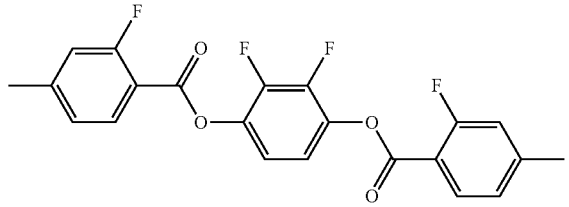 |
| (f-2-4) single bond, $(CH_2)_4$, $(CH_2)_5$, $(CH_2)_4O$, $(CH_2)_6O$ | 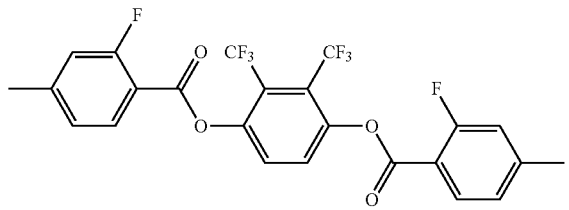 |
| (f-2-5) single bond, $(CH_2)_2$, $(CH_2)_6$, $(CH_2)_4O$, $(CH_2)_5O$ | 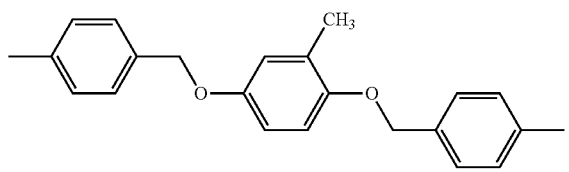 |
| (f-2-6) single bond, $(CH_2)_3$, $(CH_2)_6$, $(CH_2)_3O$, $(CH_2)_5O$ |  |
| (f-3-1) single bond, $(CH_2)_3$, $(CH_2)_4$, $(CH_2)_3O$, $(CH_2)_6O$ | 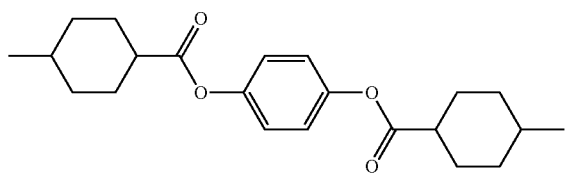 |
| (f-3-2) single bond, $(CH_2)_4$, $(CH_2)_5$, $(CH_2)_4O$, $(CH_2)_5O$ | 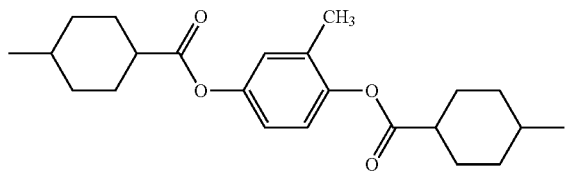 |
| (f-4-1) single bond, $(CH_2)_2$, $(CH_2)_4$, $(CH_2)_6O$, $(CH_2)_7O$ | 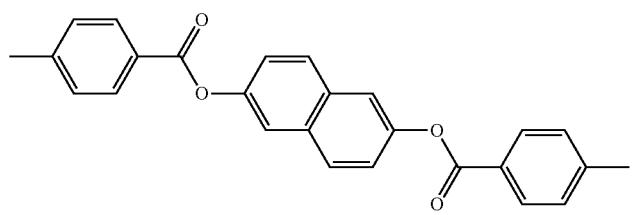 |
| (f-5-2) single bond, $(CH_2)_3$, $(CH_2)_6$, $(CH_2)_4O$, $(CH_2)_6O$ | 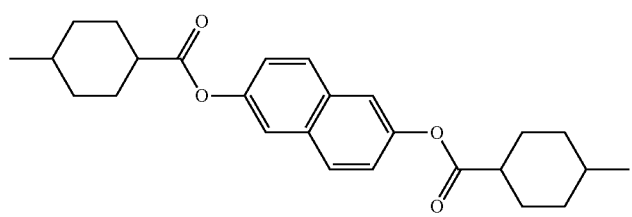 |

[Chem. 17]
| | Y | —(A—Z)m— |
|---|---|---|
| (f-6-1) | single bond, $(CH_2)_3$, $(CH_2)_7$, $(CH_2)_3O$, $(CH_2)_6O$ | 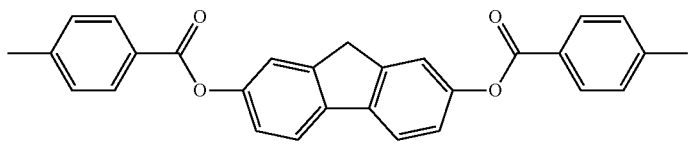 |
| (f-6-2) | single bond, $(CH_2)_3$, $(CH_2)_5$, $(CH_2)_4O$, $(CH_2)_6O$ | 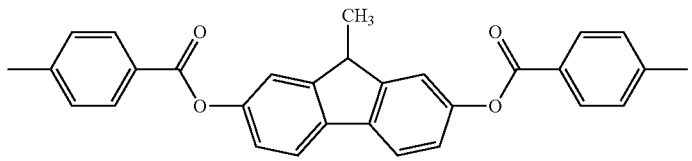 |
| (f-6-3) | single bond, $(CH_2)_4$, $(CH_2)_5$, $(CH_2)_3O$, $(CH_2)_6O$ | 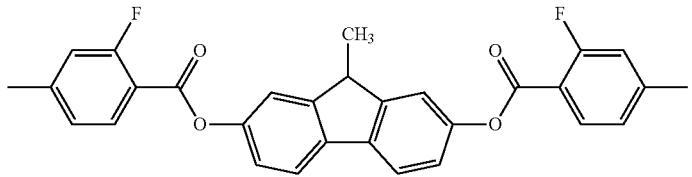 |
| (f-6-4) | single bond, $(CH_2)_3$, $(CH_2)_6$, $(CH_2)_4O$, $(CH_2)_5O$ | 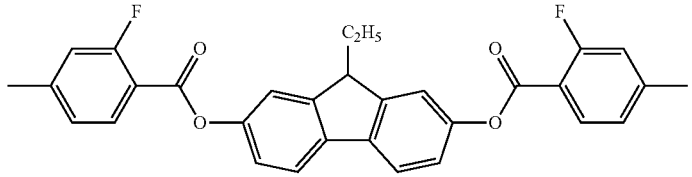 |
| (f-6-5) | single bond, $(CH_2)_4$, $(CH_2)_6$, $(CH_2)_3O$, $(CH_2)_4O$ | 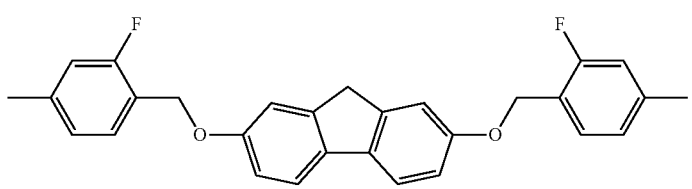 |
| (f-7-1) | single bond, $(CH_2)_4$, $(CH_2)_5$, $(CH_2)_3O$, $(CH_2)_6O$ | 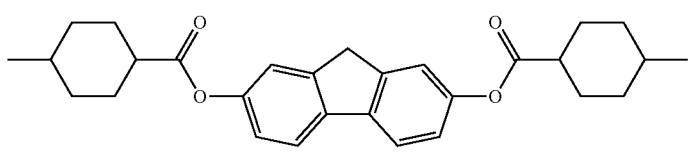 |
| (f-7-2) | single bond, $(CH_2)_3$, $(CH_2)_7$, $(CH_2)_3O$, $(CH_2)_5O$ | 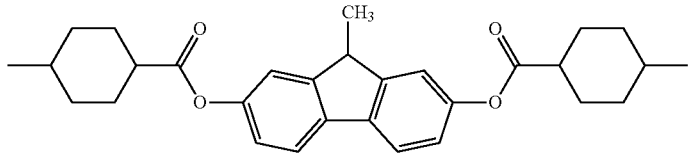 |
| (f-8-1) | single bond, $(CH_2)_3$, $(CH_2)_5$, $(CH_2)_3O$, $(CH_2)_6O$ | 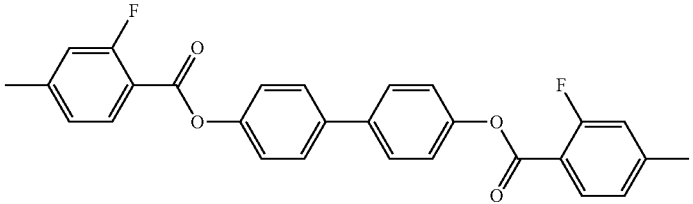 |
| (f-8-2) | single bond, $(CH_2)_5$, $(CH_2)_7$, $(CH_2)_2O$, $(CH_2)_5O$ | 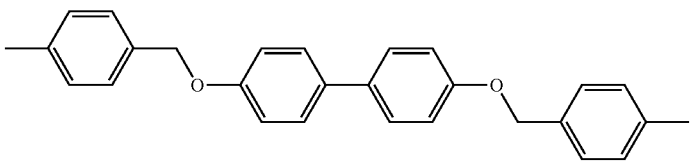 |

[Chem. 17]
| Y | —(A—Z)m— |
|---|---|
| (f-8-3) | single bond, $(CH_2)_3$, $(CH_2)_4$, $CH_3O$, $(CH_2)_4O$ | 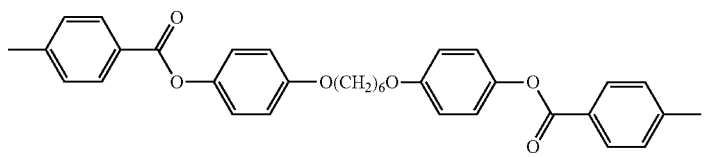 |
| (f-9-1) | single bond, $(CH_2)_2$, $(CH_2)_4$, $(CH_2)_4O$, $(CH_2)_5O$ | 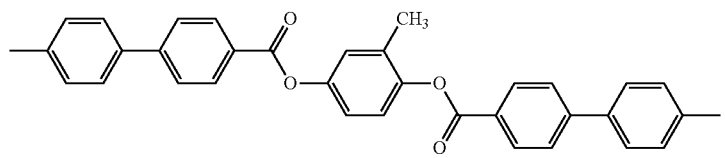 |
| (f-10-1) | single bond, $(CH_2)_3$, $(CH_2)_6$, $(CH_2)_3O$, $(CH_2)_6O$ | 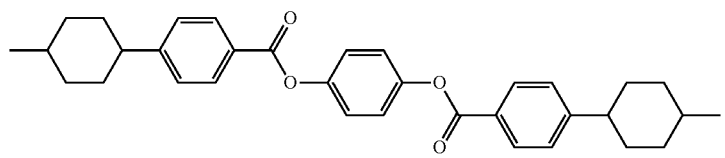 |
[Chem. 18]
| Y | —(A—Z)m— |
|---|---|
| (f-11-1) | single bond, $(CH_2)_4$, $(CH_2)_5$, $(CH2)_3O$, $(CH_2)_6O$ | 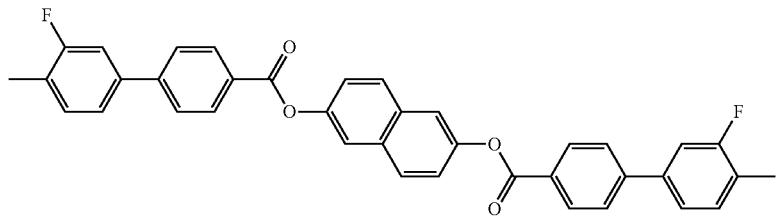 |
| (f-12-1) | single bond, $(CH_2)_3$, $(CH_2)_5$, $(CH_2)_4O$, $(CH_2)_6O$ | 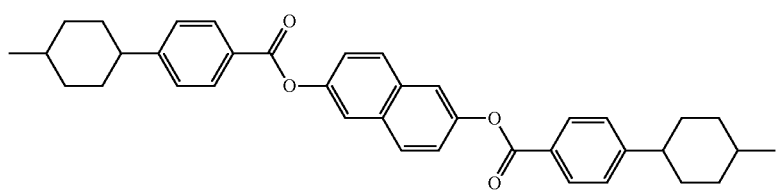 |
| (f-13-1) | single bond, $(CH_2)_3$, $(CH_2)_7$, $(CH_2)_3O$, $(CH_2)_5O$ | 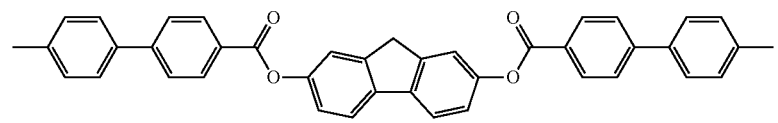 |
| (f-13-2) | single bond, $(CH_2)_4$, $(CH_2)_6$, $(CH_2)_3O$, $(CH_2)_4O$ | 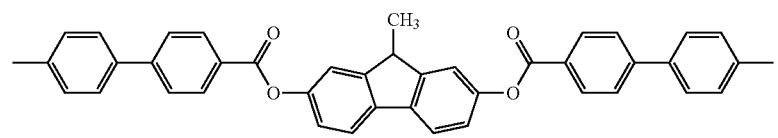 |
| (f-13-3) | single bond, $(CH_2)_3$, $(CH_2)_5$, $(CH_2)_4O$, $(CH_2)_5O$ | 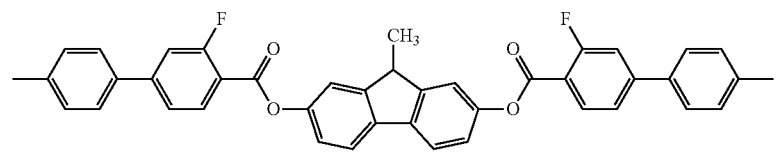 |

| [Chem. 18] | Y | | —(A—Z)m— |
|---|---|---|---|
| (f-14-1) | single bond, (CH$_2$)$_3$, (CH$_2$)$_5$, (CH$_2$)$_3$O, (CH$_2$)$_6$O | | 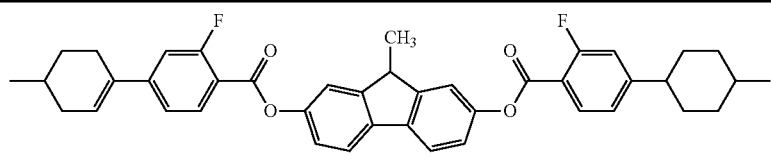 |
| (f-14-2) | single bond, (CH$_2$)$_3$, (CH$_2$)$_6$, (CH$_2$)$_3$O, (CH$_2$)$_6$O | | 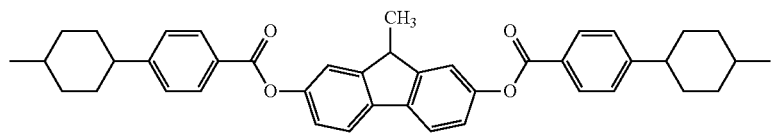 |

Method of Synthesizing the Compound (1-1)

The above compound (1-1) can be synthesized by combining methods known in organic synthetic chemistry. A method of introducing a desired terminal group, ring structure and binding group into a starting material is described in books such as Methods of Organic Chemistry (Houben-Wyle), Organic Syntheses, (Georg Thieme Verlag, Stuttgart, John Wily & Sons, Inc.), Organic Reactions (John Wily & Sons Inc.), Comprehensive Organic Synthesis (Pergamon Press), and New Experimental Chemistry Course (Maruzen Publishing Co., Ltd.). Japanese Unexamined Patent Application Publication No. 2006-265527 may also be referred to.

A bifunctional or higher polymerizable compound (hereinafter simply referred to as a "polymerizable compound") may be a polymerizable compound exhibiting no liquid crystallinity in addition to a polymerizable liquid crystal compound represented by Formula (1-1). For example, polyether diglycidyl ether, bisphenol A diglycidyl ether, bisphenol F diglycidyl ether, biphenol diglycidyl ether, or a compound having insufficient linearity and exhibiting no liquid crystallinity among the compounds of Formula (1-1) may be exemplified.

The above polymerizable compound can be synthesized by combining methods known in organic synthetic chemistry.

The polymerizable compound used in the present invention preferably includes a bifunctional or higher group and may include a trifunctional or higher functional group or a tetrafunctional or higher functional group. Further, a compound having a functional group at both ends of the long side in a polymerizable compound is preferable since it can form a linear bond.

<Inorganic Filler>

As the first inorganic filler, the second inorganic filler and the third inorganic filler, a nitride, a carbide, or a carbon material may be exemplified. The first inorganic filler and the second inorganic filler may be the same as or different from each other.

Specifically, as the first inorganic filler and the second inorganic filler, boron nitride, boron carbide, boron nitride carbon, graphite, a carbon fiber, and a carbon nanotube may be exemplified as an inorganic filler having high thermal conductivity and a very small or negative thermal expansion coefficient. In addition, the following inorganic fillers having high thermal conductivity and a positive thermal expansion coefficient may be used as either one of the first and second inorganic fillers.

As the third filler, inorganic fillers and metal fillers having high thermal conductivity and a positive thermal expansion coefficient such as silicon carbide, aluminum nitride, silicon nitride, diamond, silicon, beryllia, magnesium oxide, aluminum oxide, zinc oxide, silicon oxide, copper oxide, titanium oxide, cerium oxide, yttrium oxide, tin oxide, holmium oxide, bismuth oxide, cobalt oxide, calcium oxide, magnesium hydroxide, aluminum hydroxide, gold, silver, copper, platinum, iron, tin, lead, nickel, aluminum, magnesium, tungsten, molybdenum, and stainless steel may be exemplified.

Desirably, a structure of the polymerizable compound has a shape and a length with which it is possible to efficiently and directly bond such inorganic fillers. A type, a shape, a size, and an amount added of an inorganic filler can be appropriately selected depending on purposes. When an insulation property is necessary for the obtained heat dissipating member, an inorganic filler having conductivity may be used as long as a desired insulation property is maintained. Exemplary shapes of the inorganic filler may include a plate shape, a spherical shape, an amorphous shape, a fibrous shape, a bar shape, and a tubular shape.

Boron nitride, aluminum nitride, silicon nitride, silicon carbide, graphite, a carbon fiber, and a carbon nanotube are preferable. Hexagonal boron nitride (h-BN) or graphite is particularly preferable. Boron nitride, and graphite are preferable because thermal conductivity in a planar direction is very high and boron nitride has a small dielectric constant and has a favorable insulation property. For example, a plate-like crystalline boron nitride is preferable because a plate-like structure is likely to be oriented along a mold according to a flow of a raw material and a pressure during molding and curing.

An average particle size of an inorganic filler is preferably 0.1 to 200 μm, and more preferably 1 to 100 μm. When the average particle size is 0.1 μm or more, thermal conductivity is favorable. When the average particle size is 200 μm or less, it is possible to increase a filling rate.

Also, in this specification, the average particle size is obtained based on measurement of a particle size distribution using a laser diffraction and scattering method. That is, analysis according to Fraunhofer diffraction theory and Mie scattering theory was used, powder was divided into two based on a certain particle size using a wet method, and a size at which the larger division and the smaller division were equal (volume basis) was determined as a median size.

Proportions of an inorganic filler, a coupling agent and an organic compound depend on an amount of coupling agent bonded to an inorganic filler that is used. A compound (for example, boron nitride) used as first and second inorganic fillers has no reactive group on its surface and has a reactive group only on the side as described above. As much coupling agent as possible is bonded to a small number of reactive groups and the same number of or slightly more organic compound molecules than the number of reactive groups are preferably bonded. An amount of coupling agent reacted with an inorganic filler mainly differs according to a size of an inorganic filler or the reactivity of a coupling agent that is used. For example, when an inorganic filler is larger, a proportion of an area of the side of the inorganic filler decreases and therefore a modification amount is small. While as much coupling agent as possible is reacted, since the thermal conductivity of a product decreases as the size of particles decreases, it is preferable to achieve a balance therebetween.

<Coupling Agent>

Since a coupling agent bonded to an inorganic filler is preferably reacted with a functional group (such as an oxiranyl group) included in a polymerizable compound, a coupling agent having an amine reactive group at a terminal is preferable. For example, Sila-Ace S310, S320, S330, and S360 commercially available from JNC Corporation and KBM903 and KBE903 commercially available from Shin-Etsu Chemical Co., Ltd. may be exemplified.

Moreover, when a terminal of the polymerizable compound is an amine, a coupling agent having an oxiranyl group or the like at a terminal is preferable. For example, Sila-Ace S510 and S530 commercially available from JNC Corporation may be exemplified. Note that more modification of the inorganic filler due to the coupling agent is preferable because the number of bonds increases.

A second inorganic filler that is treated with a coupling agent and is then additionally surface-modified with a polymerizable compound is used. For example, with an inorganic filler (an inorganic filler bonded to a coupling agent) treated with a silane coupling agent, a polymerizable compound is additionally bonded to the coupling agent, and the surface of the inorganic filler is modified with the polymerizable compound. As shown in FIG. 2, the second inorganic filler whose surface is modified with the polymerizable compound can form bonds with the first inorganic filler through the polymerizable compound and the coupling agent, and this bonding significantly contributes to heat conduction.

In addition, as the second inorganic filler, an inorganic filler which is subjected to a coupling treatment with a coupling agent bonded to a polymerizable compound in advance may be used.

As the polymerizable compound, a polymerizable liquid crystal compound represented by Formula (1-1) is preferable. However, other polymerizable liquid crystal compounds may be used and a polymerizable compound having no liquid crystallinity may be used. More surface modification with a polymerizable compound is preferable because the number of bonds increases.

<Other Components>

The composition for a heat dissipating member of the present invention may further include an organic compound that is not bonded to the first inorganic filler or the second inorganic filler, that is, an organic compound that does not contribute to bonding (for example, a polymerizable compound or a polymer compound) or may include a polymerization initiator, a solvent and the like.

<Unbonded Polymerizable Compound>

The composition for a heat dissipating member may include a polymerizable compound (in this case, it may not necessarily be a bifunctional or higher compound) that is not bonded to an inorganic filler as a component. As the polymerizable compound, a compound that does not deteriorate a film foil ling property and a mechanical strength is preferable. The polymerizable compounds are classified into compounds having no liquid crystallinity and compounds having liquid crystallinity. As a polymerizable compound having no liquid crystallinity, vinyl derivatives, styrene derivatives, (meth)acrylic acid derivatives, sorbic acid derivatives, fumaric acid derivatives, and itaconic acid derivatives may be exemplified. Regarding the content thereof, first, a composition for a heat dissipating member that does not include an unbonded polymerizable compound is prepared, and a proportion of voids therein is measured, it being desirable to add the polymerizable compound in an amount at which the voids are filled.

<Unbonded Polymer Compound>

The composition for a heat dissipating member may include a polymer compound that is not bonded to an inorganic filler as a component. As the polymer compound, a compound that does not deteriorate a film fainting property and a mechanical strength is preferable. The polymer compound may be a polymer compound that does not react with the first, second and third inorganic fillers and the polymerizable compound. For example, a polyolefin resin, a polyvinyl resin, a polyamide resin, and a polyethaconic acid resin may be exemplified. Regarding the content thereof, first, a composition for a heat dissipating member that does not include an unbonded polymer compound is prepared, and a proportion of voids therein is measured, it being desirable to add the polymer compound at an amount at which the voids are filled.

<Non-Polymerizable Liquid Crystalline Compound>

The composition for a heat dissipating member may include a liquid crystalline compound having no polymerizable group as a component. Examples of such a non-polymerizable liquid crystalline compound are described in LiqCryst (LCI Publisher GmbH, Hamburg, Germany) which is a liquid crystalline compound database. When the composition containing a non-polymerizable liquid crystalline compound is polymerized, it is possible to obtain composite materials of, for example, a polymer of the compound (1-1) and a liquid crystalline compound. In such composite materials, the non-polymerizable liquid crystalline compound is present in a polymer network such as a polymer dispersed liquid crystal. Desirably, a liquid crystalline compound having a property that there is no fluidity in a temperature range that is used is preferable. After the first, second and third fillers are cured, combination may be performed using a method of performing injection into voids in a temperature range in which an isotropic phase is exhibited, a liquid crystalline compound in an amount that has been calculated in advance to fill the voids may be mixed with the first, second and third fillers and the fillers may be polymerized.

<Polymerization Initiator>

The composition for a heat dissipating member may include a polymerization initiator as a component. As the polymerization initiator, according to components of the composition and a polymerization method, for example, a photo-radical polymerization initiator, a photo-cationic polymerization initiator, and a thermal radical polymerization initiator may be used.

As a preferable initiator for thermal radical polymerization, for example, benzoyl peroxide, diisopropyl peroxydicarbonate, t-butylperoxy-2-ethylhexanoate, t-butylperoxy pivalate, di-t-butyl peroxide (DTBPO), t-butylperoxydiisobutyrate, lauroyl peroxide, 2,2'-dimethylazobisisobutyrate (MAIB), azobisisobutyronitrile (AIBN), and azobiscyclohexanecarbonitrile (ACN) may be exemplified.

<Solvent>

The composition for a heat dissipating member may contain a solvent. When a component that needs to be polymerized is included in the composition, the polymerization may be performed in the solvent or performed without a solvent. The composition containing a solvent is applied to a substrate using, for example, a spin coating method, and photopolymerization is then performed after the solvent is removed. In addition, after photocuring, post processing may be performed by performing heating to an appropriate temperature and thermosetting.

As a preferable solvent, for example, benzene, toluene, xylene, mesitylene, hexane, heptane, octane, nonane, decane, tetrahydrofuran, γ-butyrolactone, N-methylpyrrolidone, dimethylfonnamide, dimethyl sulfoxide, cyclohexane, methylcyclohexane, cyclopentanone, cyclohexanone, and PGMEA may be exemplified. Among the above solvents, one kind may be used alone two or more kinds may be used in a mixture.

Further, limiting a proportion of a solvent used during polymerization is not significant. The proportion may be determined according to individual cases in consideration of polymerization efficiency, solvent costs, energy costs, and the like.

<Others>

A stabilizer may be added to the composition for a heat dissipating member for ease of handling. As such a stabilizer, known stabilizers can be used without limitation. For example, hydroquinone, 4-ethoxyphenol and 3,5-di-t-butyl-4-hydroxytoluene (BHT) may be exemplified.

Additionally, an additive (such as an oxide) may be added to adjust a viscosity and a color of the composition for a heat dissipating member. For example, titanium oxide can be used to express white, carbon black can be used to express black, and fine silica powders can be used to adjust a viscosity. In addition, an additive may be added to further increase a mechanical strength. For example, glass, and inorganic fibers such as a carbon fiber and cloth may be used. In addition, as a polymer additive, fibers of polyvinyl formal, polyvinyl butyral, polyester, polyamide, and polyimide and long molecules may be exemplified.

[Production Method]

A method of producing a composition for a heat dissipating member and a method of producing a heat dissipating member using a composition for a heat dissipating member will be described below in detail.

<Performing Coupling Treatment>

A coupling treatment is performed on an inorganic filler and an inorganic filler to which one end of a coupling agent is bonded is used as a first inorganic filler. A known method can be used for the coupling treatment.

As an example, first, an inorganic filler and a coupling agent are added to a solvent. A stirrer or the like is used for stirring and drying is then performed. After solvent drying, a vacuum dryer or the like is used to perform a heat treatment under vacuum conditions. Solvent is added to the inorganic filler and pulverization is performed through an ultrasonic treatment. This solution is separated off and purified using a centrifuge. After a supernatant is discarded, solvent is added, and the same operation is repeated a plurality of times. An oven is used to dry the inorganic filler subjected to the coupling treatment after purifying.

<Modifying with Polymerizable Compound>

A bifunctional or higher polymerizable compound is bonded to the other end of a coupling agent on an inorganic filler subjected to a coupling treatment (an inorganic filler that may be the same or different as or from the first inorganic filler). In this manner, an inorganic filler modified with a polymerizable compound is used as a second inorganic filler.

As an example, the inorganic filler subjected to a coupling treatment and the polymerizable compound are mixed using an agate mortar or the like and are then kneaded using a biaxial roller or the like. Then, separation and purification are performed through an ultrasonic treatment and centrifugation.

<Mixing>

The first inorganic filler and the second inorganic filler are weighed out such that, for example, weights of the inorganic fillers become 1:1, and an agate mortar or the like is used for mixing. Then, a biaxial roller or the like is used for mixing and the composition for a heat dissipating member is obtained.

When binding groups that form a bond between the first inorganic filler and the second inorganic filler are amine: epoxy, a mixing ratio between the first inorganic filler and the second inorganic filler is preferably, in terms of weights of the inorganic fillers, for example, 1:1 to 1:30, and more preferably 1:3 to 1:20. The mixing ratio is determined by the number of binding groups on the terminals that form a bond between the first inorganic filler and the second inorganic filler. For example, in a secondary amine, since a reaction can occur with two oxiranyl groups, a smaller amount than that of the oxiranyl group side is favorable, and since an oxiranyl group side has a possibility of a ring being opened, a larger amount that calculated from an epoxy equivalent is preferably used.

<Producing Heat Dissipating Member>

As an example, a method of producing a film as a heat dissipating member using the composition for a heat dissipating member will be described. The composition for a heat dissipating member is inserted between heating plates using a compression molding machine and oriented, cured and molded using compression molding. Further, an oven or the like is used to perform post curing and the heat dissipating member of the present invention is obtained. Note that a pressure during compression molding is preferably 50 to 200 kgf/cm$^2$ and more preferably 70 to 180 kgf/cm$^2$. Basically, a pressure during curing is preferably higher. However, the pressure is appropriately changed according to fluidity in a mold and desired physical properties (a direction in which thermal conductivity is important) and an appropriate pressure is preferably applied.

A method of producing a film as a heat dissipating member using a composition for a heat dissipating member containing a solvent will be described in detail below.

First, the composition is applied to a substrate and the solvent is dried and removed to form a coating layer with a uniform film thickness. As a coating method, for example, a spin coating method, a roll coating method, a curtain coating method, a flow coating method, a printing method, a micro gravure coating method, a gravure coating method, a wire bar coating method, a dip coating method, a spray coating method, and a meniscus coating method may be exemplified.

The solvent can be dried and removed through, for example, air drying at room temperature, drying on a hot plate, drying in a drying furnace, and blowing warm air or hot air. Conditions in which the solvent is removed are not particularly limited, and the solvent may be removed to a large extent and dried until the coating layer has no fluidity.

As the above substrate, for example, metal substrates of copper, aluminum, and iron; inorganic semiconductor substrates of silicon, silicon nitride, gallium nitride, and zinc oxide; glass substrates of alkali glass, borosilicate glass, and flint glass, inorganic insulating substrates of alumina, and aluminum nitride; and plastic film substrates of polyimide, polyamideimide, polyamide, polyetherimide, polyetheretherketone, polyetherketone, polyketone sulfide, polyether sulfone, polysulfone, polyphenylene sulfide, polyphenylene oxide, polyethylene terephthalate, polybutylene terephthalate, polyethylene naphthalate, polyacetal, polycarbonate, polyarylate, acryl resin, polyvinyl alcohol, polypropylene, cellulose, triacetyl cellulose or partially saponified products thereof, epoxy resin, phenol resin, and norbornene resin may be exemplified.

The above film substrate may be a uniaxially stretched film or a biaxially stretched film. The above film substrate may be subjected to a surface treatment such as a saponification treatment, a corona treatment, and a plasma treatment in advance. Moreover, a protective layer not affected by the solvent contained in the composition for a heat dissipating member may be formed on such a film substrate. As a material used for the protective layer, for example, a polyvinyl alcohol may be exemplified. Moreover, an anchor coating layer may be formed to increase adhesion between the protective layer and the substrate. As long as adhesion between the protective layer and the substrate increases, such an anchor coating layer may be of either of an inorganic or organic material.

A case in which bonding of inorganic fillers is performed using an inorganic filler subjected to a coupling treatment and an inorganic filler that is subjected to a coupling treatment and is additionally modified with a polymerizable compound has been described above. Specifically, for example, the first inorganic filler is subjected to a coupling treatment using a silane coupling agent having an amino group. After the second inorganic filler is subjected to a coupling treatment using a silane coupling agent having an amino group, an amino group and one end of a polymerizable compound having an epoxy group at both ends are bonded. Finally, the amino group on the first inorganic filler side and the epoxy group on the other side included in the polymerizable compound on the second inorganic filler side are bonded (refer to FIG. 2). Also, a combination in which the inorganic filler side includes an epoxy group and the polymerizable compound side includes an epoxy group may be used.

As another method, it is possible to use a coupling agent modified with a polymerizable compound in advance. For example, the first inorganic filler is subjected to a coupling treatment using a silane coupling agent having an amino group. Next, a silane coupling agent having a vinyl group is modified with a polymerizable compound having a vinyl group and an epoxy group at the terminals and then a coupling treatment is performed using the second inorganic filler modified with this silane coupling agent. Finally, the amino group on the first inorganic filler side and the epoxy group included in the polymerizable compound on the second inorganic filler side are bonded (refer to FIG. 2).

Figure 3:
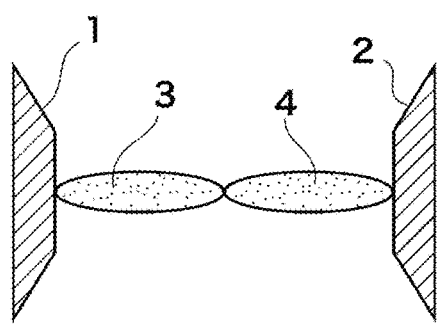
FIG. 3 is a conceptual diagram showing a state in which the other end of the coupling agent 3 bonded to the first inorganic filler 1 is bonded to a coupling agent 4 on the second inorganic filler 2 by curing a composition for a heat dissipating member.

As another method, inorganic fillers may be bonded to each other through a bond between coupling agents without using a polymerizable compound. For example, the first inorganic filler may be subjected to a coupling treatment using a silane coupling agent having an amino group. The second inorganic filler is subjected to a coupling treatment using a silane coupling agent having an epoxy group. Finally, the amino group on the first inorganic filler side and the epoxy group on the second inorganic filler side are bonded (refer to FIG. 3). In this manner, the coupling agent bonded to the first inorganic filler and the coupling agent bonded to the second inorganic filler each have a functional group that bonds the coupling agents. The functional group on the first inorganic filler side and the functional group on the second inorganic filler side may be a combination of different functional groups or a combination of the same functional groups as long as bonding of coupling agents is possible.

As a combination of functional groups that form a bond between coupling agents, for example, a combination of an oxiranyl group and an amino group, a combination of vinyl groups, a combination of methacryloxy groups, a combination of a carboxy group or a carboxylic acid dianhydride group and an amino group, and a combination of an imidazole group and an oxiranyl group may be exemplified, but the present invention is not limited thereto. A combination having high heat resistance is preferable.

In this manner, when the coupling agent and the polymerizable compound are appropriately selected, it is possible to connect the first inorganic filler and the second inorganic filler, and it is possible to obtain a heat dissipating member that has extremely high thermal conductivity and a thermal expansion coefficient which can be controlled from the composition for a heat dissipating member of the present invention. Note that the above functional groups are only examples, and the present invention is not limited to the above functional groups as long as the effects of the present invention can be obtained.

[Heat Dissipating Member]

A heat dissipating member according to a second embodiment of the present invention is obtained by molding a cured product obtained by curing the above composition for a heat dissipating member according to the first embodiment depending on applications. The cured product has high thermal conductivity and a negative or very small positive thermal expansion coefficient, and is excellent in terms of chemical stability, a heat resistance, a hardness and a mechanical strength. Further, the mechanical strength is a Young's modulus, a tensile strength, a tear strength, a bending strength, a bending elastic modulus, or an impact strength.

The heat dissipating member of the present invention is useful for a heat sink, a heat dissipation sheet, a heat dissipating film, a heat dissipation adhesive, and a heat dissipation molded article.

Regarding conditions in which the composition for a heat dissipating member is cured through thermal polymerization, a thermosetting temperature is in a range of room temperature to 350° C., preferably room temperature to 250° C., and more preferably 50° C. to 200° C. The curing time is in a range of 5 seconds to 10 hours, preferably 1 minute to 5 hours, and more preferably 5 minutes to 1 hour. After the polymerization, it is preferable to gradually cool in order to prevent stress distortion. In addition, a reheating treatment may be performed to alleviate distortion and the like.

The heat dissipating member of the present invention is formed of the above composition for a heat dissipating member and is used in shapes such as a sheet, a film, a thin film, a fiber, and a molded body. A preferable shape is a plate, a sheet, a film and a thin film. Moreover, in this specification, a film thickness of the sheet is 1 mm or more, and a film thickness of the film is 5 μm or more, preferably 10 to 500 μm, and more preferably 20 to 300 μm. A film thickness of the thin film is less than 5 μm. The film thickness may be appropriately changed depending on applications.

[Electronic Apparatus]

An electronic apparatus according to a third embodiment of the present invention includes the above heat dissipating member according to the second embodiment and an electronic device including a heating unit. The heat dissipating member is disposed in an electronic device in contact with the heating unit. The form of the heat dissipating member may be any form of a heat dissipating electronic substrate, a heat sink, a heat dissipation sheet, a heat dissipating film, a heat dissipation adhesive, and a heat dissipating molded article.

For example, a semiconductor device may be exemplified as the electronic device. The heat dissipating member of the present invention has a high heat resistance and a high insulating property in addition to high thermal conductivity. Therefore, it is particularly effective in an insulated gate bipolar transistor (IGBT) requiring a more efficient heat dissipation mechanism for high power among semiconductor devices. An IGBT is one of semiconductor devices, is a bipolar transistor in which a MOSFET is incorporated in a gate portion, and is used for power control. Examples of an electronic apparatus including an IGBT include a main conversion element of a high power inverter, an uninterruptible power system, a variable voltage variable frequency control device of an AC electric motor, a control device of a railway car, an electric transport device such as a hybrid car and an electric car, and an IH cooker.

While the present invention in which the first inorganic filler subjected to a coupling treatment and the second inorganic filler that is subjected to a coupling treatment and is then additionally modified with a polymerizable compound are bonded to form a bond between the inorganic fillers and thus the heat dissipating member having high thermal conductivity is obtained has been described above, the present invention is not limited thereto. Needless to say, a first inorganic filler that is subjected to a coupling treatment and is then additionally modified with a polymerizable compound and a second inorganic filler subjected to a coupling treatment may be bonded to form a bond between the inorganic fillers.

In addition, the composition for a heat dissipating member of the present invention may additionally contain a plurality of types of inorganic filler such as third and fourth inorganic fillers. For example, as a third inorganic filler having a thermal expansion coefficient different from those of the first inorganic filler and the second inorganic filler, a third inorganic filler having thermal conductivity that is bonded to one end of a coupling agent or a third inorganic filler having thermal conductivity that is bonded to one end of a coupling agent to which a polymerizable compound is bonded may be additionally contained.

Further, using only an inorganic filler that is subjected to a coupling treatment and is then additionally modified with a polymerizable compound, polymerizable compounds may be bonded to each other through an appropriate polymerization initiator or the like and a bond between inorganic fillers may be formed.

That is, when an inorganic material and an organic compound are combined, the present invention forms a bond between inorganic materials with an organic compound and significantly improves thermal conductivity, and additionally a thermal expansion coefficient may be controlled.

EXAMPLES

The present invention will be described below in detail with reference to examples. However, the present invention is not limited to details described in the following examples.

Component materials of the heat dissipating member used in examples of the present invention are as follows.

<Polymerizable Liquid Crystal Compound>

Liquid crystalline epoxy: the following Formulae (3-1) to (6-1) (commercially available from JNC Corporation), which can be synthesized by a method described in Japanese Patent No. 5084148.

[Chem. 19]

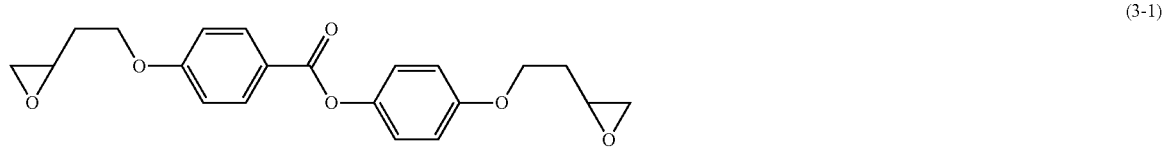

(3-1)

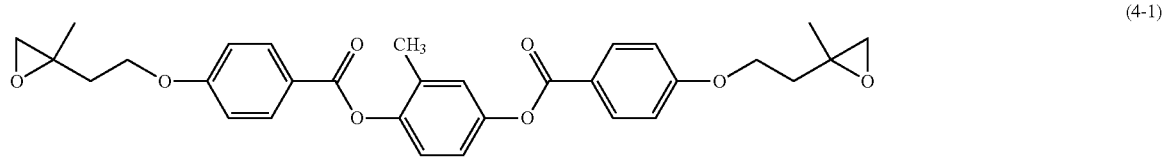

(4-1)

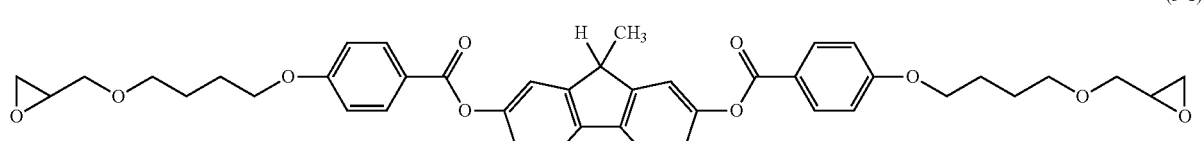

(5-1)

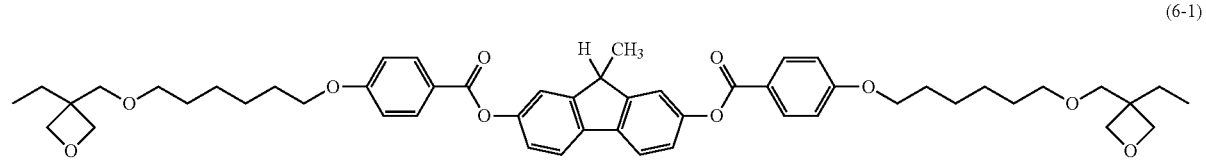

(6-1)

<Polymerizable Compound>

Epoxy: jER828 (trade name, commercially available from Mitsubishi Chemical Corporation)

[Chem. 20]

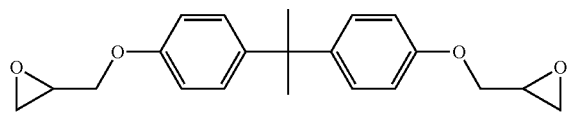
(7-1)

1,4-Butanediol diglycidyl ether (commercially available from Tokyo Chemical Industry Co., Ltd.)

[Chem. 21]

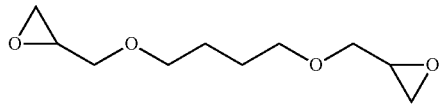
(8-1)

<Filler>

Boron nitride: h-BN particles ((trade name) PolarTherm PTX-25 commercially available from Momentive Performance Materials Inc. Japan)

<Silane Coupling Agent>

3-Aminopropyltrimethoxysilane ((trade name) KBM-903 commercially available from Shin-Etsu Chemical Co., Ltd.)

[Chem. 22]

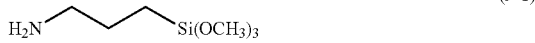
(9-1)

N-(2-Aminoethyl)-3-aminopropyltrimethoxysilane ((trade name) S320 commercially available from JNC Corporation)

[Chem. 23]

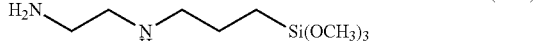
(10-1)

3-Glycidoxypropyltrimethoxysilane ((trade name) S510 commercially available from JNC Corporation)

[Chem. 24]

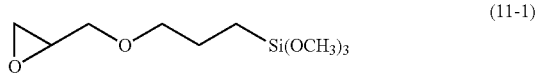
(11-1)

2-(3,4-Epoxycyclohexyl)ethyltrimethoxysilane ((trade name) S530 commercially available from JNC Corporation)

[Chem. 25]

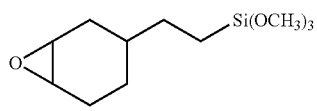
(12-1)

Example 1

<Preparation of Heat Dissipating Member>

An example of preparation of a heat dissipating member will be described below.

Preparation of Boron Nitride Particles Treated with a Coupling Agent 5.0 g of boron nitride particles (PTX25, hereinafter referred to as BN particles) and 0.75 g of 3-aminopropyltrimethoxysilane were added to 50 mL of toluene (anhydrous), and stirred using a stirrer at 750 rpm for 1 hour. The obtained mixture was dried at 40° C. for 5 hours and at room temperature for 19 hours. Additionally, after a solvent was dried, heating was performed for 5 hours using a vacuum dryer set at 125° C. under vacuum conditions.

The BN particles modified with the coupling agent were moved to a sample tube, 50 mL of THF (commercially available from Nacalai Tesque) was added, and pulverization was then performed through an ultrasonic treatment (MODEL 450 commercially available from BRANSON). Additionally, the solution was separated off and purified using a centrifuge (CT6E commercially available from Hitachi Koki Co., Ltd.) at 6000 rpm for 10 minutes. After the supernatant was discarded, 50 mL of acetone was added, and the same operation was performed twice. The modified BN particles after purification were dried in an oven at 60° C. for 24 hours. The obtained particles were used as a first inorganic filler A.

2 g and 4 g of the first inorganic filler A and the liquid crystalline epoxy (3-1) were weighed out (blending ratio of BN particles was 19 volume %, respectively, on pharmaceutical paper), and mixed using a mortar, and kneading was then performed using a biaxial roller (HR-3 commercially available from Nitto Corporation) at 120° C. for 10 minutes. Then, separation and purification were performed through an ultrasonic treatment and centrifugation and BN particles modified with a coupling agent from which unreacted components were removed were obtained. The particles were used as a second inorganic filler B.

In the first inorganic filler A and the second inorganic filler B, a coverage of a silane coupling agent or a liquid crystalline epoxy with respect to BN particles was computed using a TG-DTA device (EXSTAR TG/DTA5200 commercially available from Seiko Instruments Inc. (now HITACHI High-Tech Science Corp.)) based on a loss on heating at 600° C.

Mixing the First Inorganic Filler a with the Second Inorganic Filler B 0.5972 g of the prepared first inorganic filler A was weighed out, 1.4812 g of the prepared second inorganic filler B was weighed out, and the fillers were mixed using an agate mortar and then mixed using a biaxial roller at 55° C. for 10 minutes. The weight ratio was computed as 1:1, indicating the number of NH's (equivalent to two NH groups because a reactive group of KBM903 was NH$_2$) of the first inorganic filler A and the number of epoxy rings of the second inorganic filler B.

Polymerization and Molding

The obtained mixture was inserted between stainless steel plates and was pressurized to 9.8 MPa using a compression molding machine (F-37 commercially available from SHINTO Metal Industries Corporation) set to 150° C., and a heating state was continued for 15 minutes to perform an orientation treatment and pre-curing. That is, when the mixture spread between the stainless steel plates, since BN particles were plate-like particles, the particles and the stainless steel plates became oriented parallel to each other. In addition, an amount of sample was adjusted so that the thickness of the sample was about 200 μm. Additionally, post-curing was performed using an oven at 80° C. for 1 hour and at 150° C. for 3 hours and a target heat dissipating member of the present invention was obtained. Furthermore, in this state, the total amount of the silane coupling agent and the polymerizable liquid crystal compound was about 15 volume %.

Evaluation of Thermal Conductivity and Thermal Diffusivity

For thermal conductivity, a specific heat (measured using a DSC type input compensation type differential scanning calorimeter (EXSTAR 6000 commercially available from Seiko Instruments Inc. (now HITACHI High-Tech Science Corp.))) and a specific gravity (measured using a specific gravity meter AG204 density measurement kit commercially available from Mettler-Toledo International Inc.) of a heat dissipating member were obtained in advance, and the values were multiplied by a thermal diffusivity obtained using a thermal diffusivity measuring device (TC7000 commercially available from ADVANCE RIKO, Inc.) to obtain a thermal conductivity. In addition, thermal diffusivity in a thickness direction was measured using a standard sample holder when a blackening treatment was performed on the sample using a carbon spray. In addition, thermal diffusivity in a planar direction was obtained by providing an adapter such that an interval between a position to which a laser beam was emitted and a position at which infrared rays were detected was 5 mm, and calculation was performed based on a distance and a time from emission of the laser beam to a sample to radiation of infrared rays.

Evaluation of Thermal Expansion Coefficient

A 5×20 mm test piece was cut from the obtained sample and a thermal expansion coefficient (measured using a TMA7000 type thermomechanical analyzer commercially available from now HITACHI High-Tech Science Corp.) was obtained in a range of room temperature to 250° C. The range of the temperature was appropriately adjusted according to the heat resistance of a sample to be measured.

Example 2

A sample was prepared in the same manner as in Example 1 except that a commercially available bisphenol A type polymerizable compound (jER828) exhibiting no liquid crystallinity was used as a polymerizable compound in place of the polymerizable liquid crystal compound (3-1), 0.5687 g of the first inorganic filler A was used, and 1.5084 g of a second inorganic filler C was used and the sample was evaluated. The result was used for Example 2.

Comparative Example 1

The same polymerizable liquid crystal compound (3-1) as used in Example 1, the first inorganic filler A, and a curing agent in which an amine curing agent (4,4'-diamino-1,2-diphenylethane (commercially available from Wako Pure Chemical Industries, Ltd.) was weighed out on pharmaceutical paper such that there was 15 volume % of a resin component (liquid crystalline epoxy component+diamine component) were mixed using a mortar, and kneading was then performed using a biaxial roller (HR-3 commercially available from Nitto Corporation) at 120° C. for 10 minutes. The mixture was inserted between stainless steel plates in the same manner as in Example 1, and polymerized and molded by heat-pressing.

Comparative Example 2

The same commercially available bisphenol A type polymerizable compound (jER828) exhibiting no liquid crystallinity used in Example 2, the first inorganic filler A, and a curing agent in which an amine curing agent (4,4'-diamino-1,2-diphenylethane (commercially available from Wako Pure Chemical Industries, Ltd.)) was weighed on pharmaceutical paper so that a resin component was 15 volume % were mixed using a mortar, and kneading was then performed using a biaxial roller (HR-3 commercially available from Nitto Corporation) at 120° C. for 10 minutes. The mixture was inserted between stainless steel plates in the same manner as in Example 1 and polymerized and molded by heat-pressing.

Thermal conductivities of Examples 1 and 2 and Comparative Examples 1 and 2 were measured, and the results are shown in Table 1.

TABLE 1

| Thermal conductivity of BN composite material | | | |
|---|---|---|---|
| | Actual composition (BN: weight ratio of polymerizable compounds) | Thermal conductivity in x-y direction (W/mK) | Thermal conductivity in thickness direction (W/mK) |
| Example 1 | 85:15 | 55.4 | 11.4 |
| Example 2 | 80:20 | 35.5 | 4.2 |
| Comparative Example 1 | 80:20 | 52.1 | 5.1 |
| Comparative Example 2 | 80:20 | 32.4 | 1.7 |

Examples 1 and 2 and Comparative Examples 1 and 2 were slightly different in compositions. However, in the method in which fillers were directly bonded to each other through a silane coupling agent and a polymerizable compound according to the method of the present invention, the effects of thermal conductivity in the planar direction having almost the same performance and thermal conductivity in the thickness direction being improved by a factor of 2 or more compared to when a diamine was used as a curing agent can be understood to have been obtained. This is considered to be caused by edge parts (reactive parts) of plate-like BN particles stacked in parallel being directly bonded through polymerizable molecules and heat being transferred due to phonon oscillation through the molecules.

Example 3

A sample was prepared in the same manner as in Example 1 except that a mixture obtained by mixing a polymerizable liquid crystal compound and a commercially available bisphenol A type polymerizable compound exhibiting no liquid crystallinity at a molar ratio of 1:1 was used as polymerizable compounds. A thermal expansion coefficient was evaluated. The result was used for Example 3.

Example 4

A sample was prepared in the same manner as in Example 1 except that a commercially available 1,4-butanediol diglycidyl ether exhibiting no liquid crystallinity (commercially available from Tokyo Chemical Industry Co., Ltd.) was used as a polymerizable compound. A thermal expansion coefficient was evaluated. The result was used for Example 4.

Figure 4A:
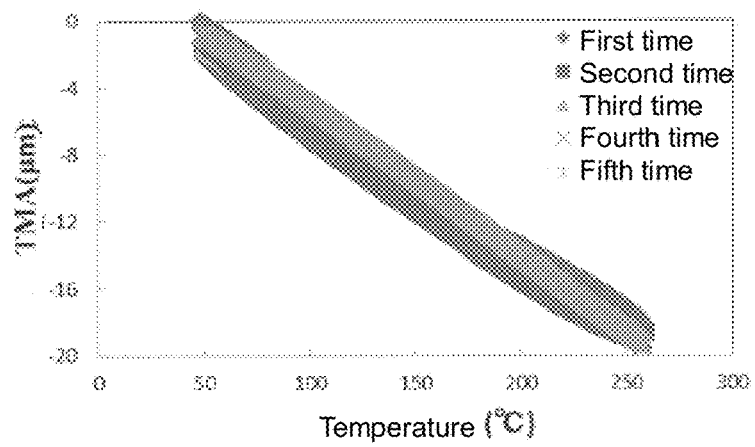
Figure 4B:
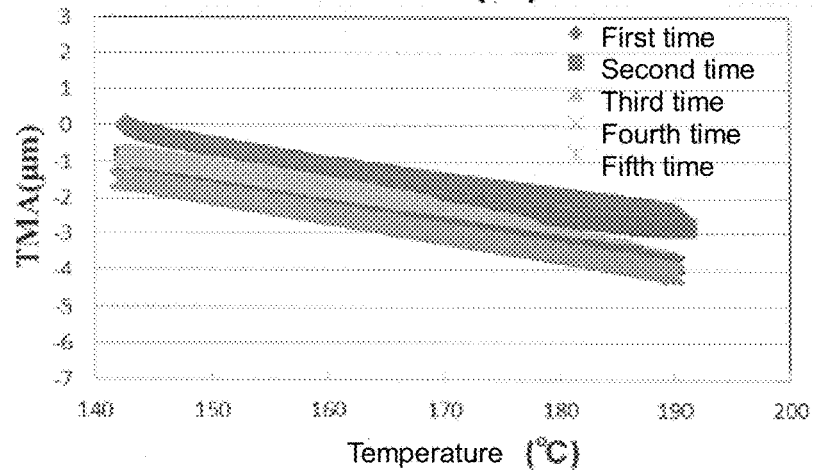
Figure 4C:
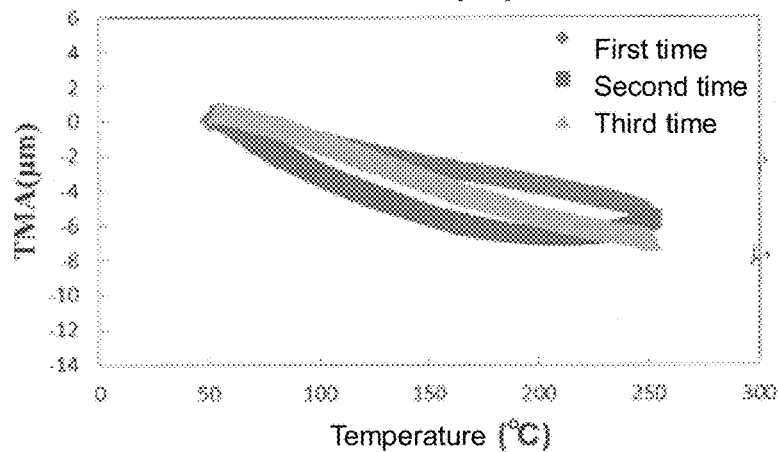

Thermal expansion coefficients of the samples of Examples 1, 2, and 4, and Comparative Example 1 were measured. The results are shown in FIGS. 4(a) to 4(d) and 4(d'). FIG. 4(a) is results of measurement of thermal expansion coefficient of Example 1 sample. FIG. 4(b) is results of measurement of thermal expansion coefficient of Example 2 sample (high temperature side). FIG. 4(c) is results of measurement of thermal expansion coefficient of Example 4 sample. FIG. 4(d) is results of measurement of thermal expansion coefficient of Comparative Example 1 sample (high temperature side). FIG. 4(d') is results of measurement of thermal expansion coefficient of Comparative Example 1 sample (low temperature side).

Based on such results, it can be understood that the composite material of the present invention had a negative thermal expansion coefficient in a temperature range of a heat resistant temperature or lower. This negative thermal expansion coefficient is considered to be caused by a thermal expansion property of the inorganic filler. In addition, it can be understood that, when a liquid crystalline polymerizable compound was used, a heat resistant temperature and repetitive stability of a temperature cycle were favorable. This is considered to be caused by the fact that, since the liquid crystalline polymerizable compound linearly propagated the phonon, heat conduction was favorable, and molecule chains themselves having many cyclic structures also had high heat resistance. On the other hand, when a diamine was used as a curing agent, if the polymerizable compound was liquid crystalline, a negative thermal expansion coefficient was observed in a temperature range of 100 C or lower, and a positive thermal expansion coefficient was observed in a temperature range of 100° C. or higher. Since the heat dissipating material is generally used at a high temperature, if a thermal expansion coefficient changes around 100° C., this is not preferable.

While materials having a negative thermal expansion coefficient are found among some ceramic and graphite materials, since there were no such examples among organic and inorganic hybrid materials, this is considered to be suitable for use in a device part in which there are problems of heat dissipation and thermal expansion.

According to the examinations up to Example 4, it was found that the heat dissipating member of the present invention had a negative thermal expansion coefficient. In actual electronic devices, when a device had a similar thermal expansion coefficient to that of a semiconductor such as silicon or silicon carbide, stress due to a thermal change was low. Therefore, a filler having a positive thermal expansion coefficient was additionally combined and thus adjustment of a thermal expansion coefficient was attempted.

Example 5

The polymerizable liquid crystal compound (3-1) was used as a polymerizable compound. 0.5954 g and 1.6400 g of powders obtained by modifying spherical alumina (TS-6 (LV) commercially available from Tatsumori Ltd.) with a silane coupling agent in the same manner as in the first inorganic filler A and the second inorganic filler B (powders obtained by modifying BN particles with a silane coupling agent and a polymerizable liquid crystal compound) were weighed out, respectively, and mixed. The powders were polymerized and molded in the same manner as in Example 1 and thermal conductivity and a thermal expansion coefficient thereof were evaluated.

Example 6

The polymerizable liquid crystal compound (3-1) was used as a polymerizable compound. 0.5954 g and 1.6400 g of powders obtained by modifying a plate-like alumina (Serath YFA02025 commercially available from Kinsei Matec Co., Ltd.) with a silane coupling agent in the same manner as in the first inorganic filler A and the second inorganic filler B (powders obtained by modifying BN particles with a silane coupling agent and a polymerizable liquid crystal compound) were weighed out, respectively, and mixed. The powders were polymerized and molded in the same manner as in Example 1 and thermal conductivity and a thermal expansion coefficient thereof were evaluated.

Example 7

The polymerizable liquid crystal compound (3-1) was used as a polymerizable compound. 0.0396 g and 0.4035 g of powders obtained by modifying an aluminum nitride powder (commercially available from Tokuyama Corporation, Grade H) with a silane coupling agent in the same manner as in the first inorganic filler A and the second inorganic filler B (powders obtained by modifying BN particles with a silane coupling agent and a polymerizable liquid crystal compound) were weighed out, respectively, and mixed. The powders were polymerized and molded in the same manner as in Example 1 and thermal conductivity and a thermal expansion coefficient thereof were evaluated.

Example 8

The polymerizable liquid crystal compound (3-1) was used as a polymerizable compound. 0.1230 g and 0.3510 g of powders obtained by modifying aluminum nitride powders (commercially available from Tokuyama Corporation, Grade H) with a silane coupling agent in the same manner as in the first inorganic filler A and the second inorganic filler B (powders obtained by modifying BN particles with a silane coupling agent and a polymerizable liquid crystal compound) were weighed out, respectively, and mixed. The powders were polymerized and molded in the same manner as in Example 1 and thermal conductivity and a thermal expansion coefficient thereof were evaluated.

The measurement results of Examples 5 to 8 are shown in Table 2.

TABLE 2

Figure 5A:
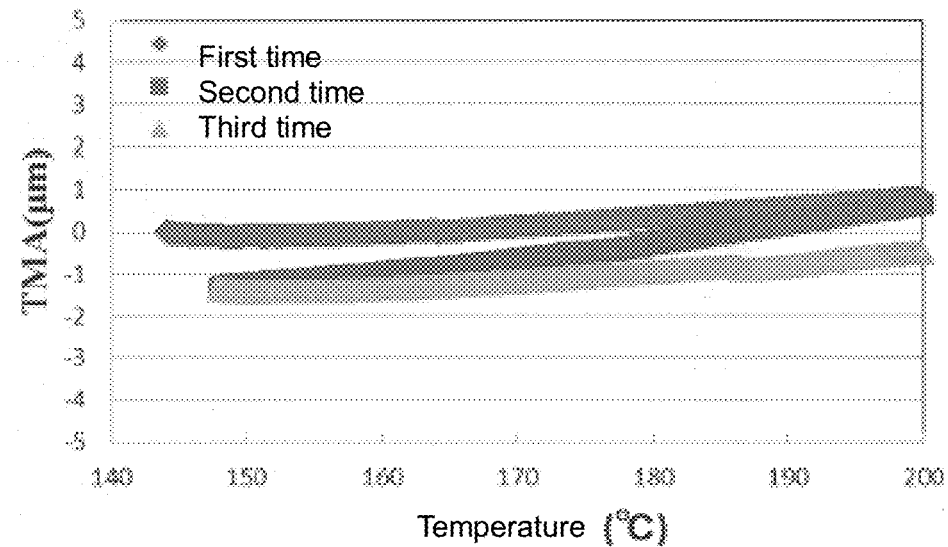
FIGS. 5(a) to 5(d) respectively shows the measured results of thermal expansion coefficients of the samples of Examples 5 to 8.

|  | Thermal conductivity in planar direction (W/mK) | Thermal conductivity in thickness direction (W/mK) | Thermal expansion coefficicient |
|---|---|---|---|
| Example 5 (spherical alumina + BN) | 29.5 | 11.4 | as shown in FIG. 5(a) |

TABLE 2-continued

Figure 5B:
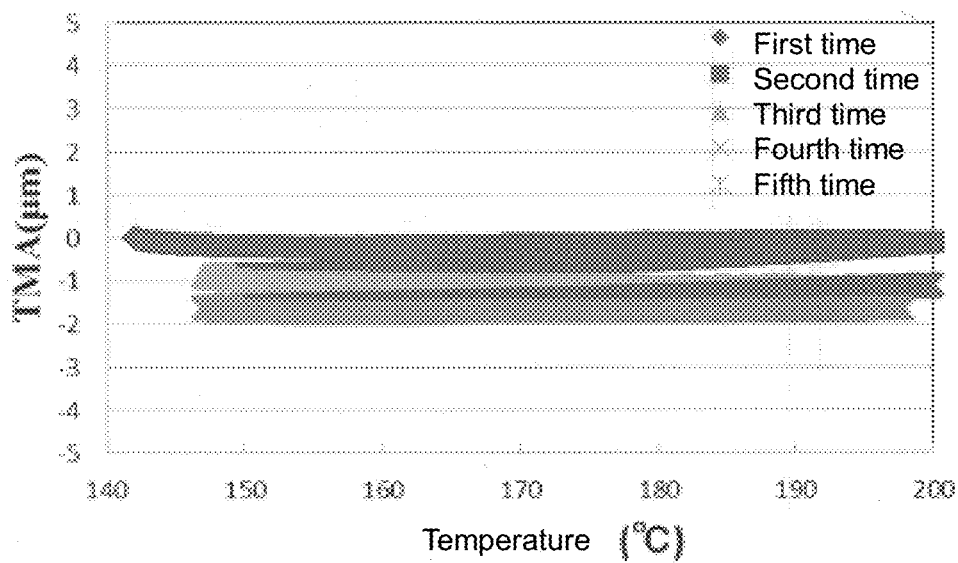
Figure 5C:
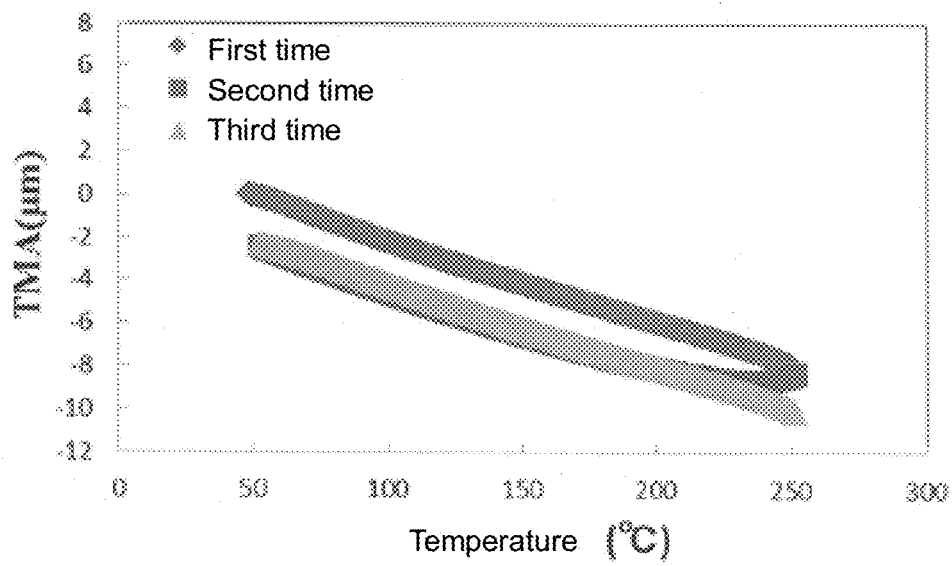
Figure 5D:
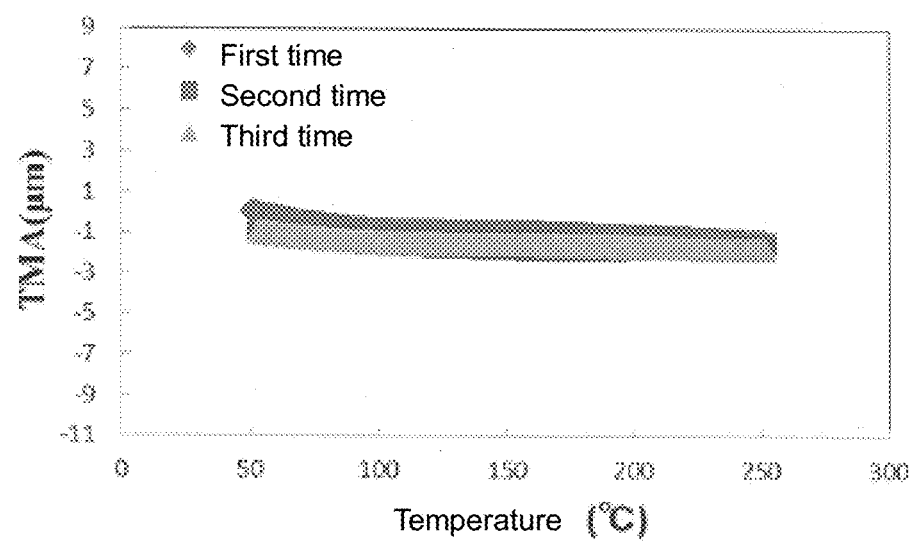

| | Thermal conductivity in planar direction (W/mK) | Thermal conductivity in thickness direction (W/mK) | Thermal expansion coefficicient |
|---|---|---|---|
| Example 6 (plate-like alumina + BN) | 28.0 | 5.8 | as shown in FIG. 5(b) |
| Example 7 (AlN + BN) | 37.5 | 9.2 | as shown in FIG. 5(c) |
| Example 8 (AlN + BN) | 33.9 | 9.3 | as shown in FIG. 5(d) |

Based on Table 2, it can be understood that, when an inorganic filler (such as alumina and AlN) having a positive thermal expansion coefficient was added at an appropriate amount, it was possible to adjust a thermal expansion coefficient from negative to positive according to the amount added. In addition, when aluminum nitride was added as an inorganic filler, thermal conductivity was higher than when alumina was added as an inorganic filler. This is considered to be caused by dependence on thermal conductivity of the inorganic filler itself. In addition, it can be understood that, when the inorganic filler was added, a balance between thermal conductivity in the planar direction and thermal conductivity in the thickness direction was changed. This is considered to be caused by an orientation state of plate-like particles of boron nitride being disturbed due to the added inorganic filler. Desirably, a balance between thermal conductivity and a thermal expansion coefficient is appropriately adjusted according to a device to be used.

In Example 1 to Example 8, the liquid crystalline epoxy of Formula (3-1) was used. Alternatively, the liquid crystalline epoxy of Formula (4-1) was used in Example 9, the liquid crystalline epoxy of Formula (5-1) was used in Example 10, the liquid crystalline epoxy of Formula (6-1) was used in Example 11, and the same experiment as in Example 1 was performed. Here, a curing temperature increased to 180° C. only in Example 11. This is because an oxetanyl group had lower reactivity than an oxiranyl group, polymerization insufficiently proceeded at the same reaction temperature, and a very fragile sample was thus obtained.

The measurement results of Examples 9 to 11 are shown in Table 3.

TABLE 3

Figure 6:
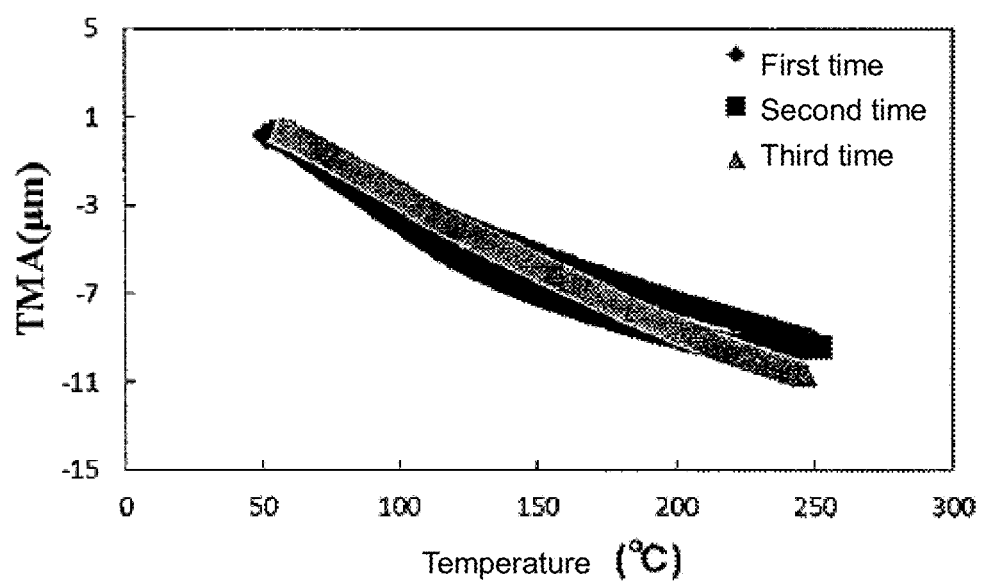
FIG. 6 shows the measured results of thermal expansion coefficients of the samples of Example 11.

| | Thermal conductivity in planar direction (W/mK) | Thermal conductivity in thickness direction (W/mK) | Thermal expansion coefficient |
|---|---|---|---|
| Example 9 (4-1) | 47.4 | 6.3 | Unmeasured |
| Example 10 (5-1) | 45.2 | 10.2 | Unmeasured |
| Example 11 (6-1) | 52.3 | 9.0 | as shown in FIG. 6 |

Comparing Example 1 and Example 9, it was expected that more benzene rings would have led to more favorable heat conduction, but a high minus value was obtained due to the ester bond that connects them. In addition, when comparing Examples 9 and 10, if structures were similar, a compound having a rigid and large ring structure was thought to have faster phonon conduction and faster heat conduction. In addition, when comparing Examples 10 and 11, it was thought that, since a compound having an oxiranyl group has higher reactivity and the number of bonds between inorganic fillers is higher, thermal conductivity was favorable. Moreover, in Table 4, a value of thermal conductivity in the planar direction was higher in Example 11 than in Example 10. This is considered to be caused by the fact that, since a curing temperature in Example 11 increased to 20° C., voids during curing are reduced, and heat conduction increased.

In addition, in Example 11 in which a liquid crystalline epoxy having a structure that was most dissimilar to that of Example 1 was used, a negative thermal expansion coefficient was observed. This is considered to be caused by the fact that a negative thermal expansion coefficient was caused due to a characteristic of an inorganic filler rather than an epoxy. In consideration of the results of Example 2, as an epoxy compound to be used in the present invention, an epoxy compound having high reactivity with a coupling agent and having heat resistance is preferably selected. When an epoxy was liquid crystalline, thermal conductivity was also high and heat resistance increased due to its structure. Therefore, desirably, the epoxy compound is appropriately selected according to characteristics required when using a device.

According to the present invention, it is possible to realize a heat dissipating member that has high thermal conductivity, in which a thermal expansion coefficient can be adjusted from negative to positive, which has insulating properties, which has thermosetting properties, and which has favorable processability. When this heat dissipating member is used, it is possible to manufacture a device having highly reliable heat dissipation properties and thermal cycling characteristics.

Examples 12 and 13

<Preparation of Heat Dissipating Member>

In the same manner as in Example 1, 5.0 g of BN particles (PTX25 commercially available from Momentive) and 2.00 g of N-(2-aminoethyl)-3-a nopropyltrimethoxysilane (S320 commercially available from JNC Corporation) were added to 50 mL of toluene (anhydrous), stirred using a stirrer at 750 rpm for 1 hour, and left at 40° C. for 5 hours and at room temperature for 19 hours. After a solvent was dried, heating was performed using a vacuum dryer set to 125° C. for 5 hours under vacuum conditions.

The BN particles modified with the coupling agent were moved to a sample tube, 50 mL of THF (commercially available from Nacalai Tesque) was added, and pulverization was then performed through an ultrasonic treatment (MODEL 450 commercially available from BRANSON). Additionally, the solution was separated off and purified using a centrifuge (CT6E commercially available from Hitachi Koki Co., Ltd.) under conditions of 6000 rpm for 10 minutes. After the supernatant was discarded, 50 mL of acetone was added and the same operation was performed twice. The purified BN particles were left in an oven at 60° C. for 24 hours and dried. The obtained particles were used as a first inorganic filler D.

In addition, the same operation was performed using 3-glycidoxypropyltrimethoxysilane (S510 commercially available from JNC Corporation) and a second inorganic filler E was obtained.

In addition, the same operation was performed using 2-(3,4-epoxycyclohexyl)ethyltrimethoxysilane (S530 commercially available from JNC Corporation) and a second inorganic filler F was obtained.

Application amounts of the above inorganic fillers D to F with respect to a silane coupling agent were computed in the same manner as in Example 1 using a TG-DTA device based on a loss on heating at 600° C.

<Preparation of Test Piece>

A first inorganic filler D and a second inorganic filler E were weighed at a predetermined blending ratio, mixed using an agate mortar, and were then kneaded for 10 minutes in the same manner as in Example 1. The obtained mixture was heated at 150° C. using a compression molding machine, was input to a mold, and was subjected to an orientation treatment for 20 minutes, and post-curing was performed at 180° C. for 3 hours to prepare a sample. A proportion of BN particles in the sample was 92 volume % (Example 12).

In the same manner, a first inorganic filler D and a second inorganic filler F were subjected to an orientation treatment and post-curing to prepare a sample. A proportion of BN particles in the sample was 90 volume % (Example 13).

Thermal conductivities and thermal expansion coefficients of the samples of Example 12 and Example 13 are shown in Table 4.

TABLE 4

Figure 7A:
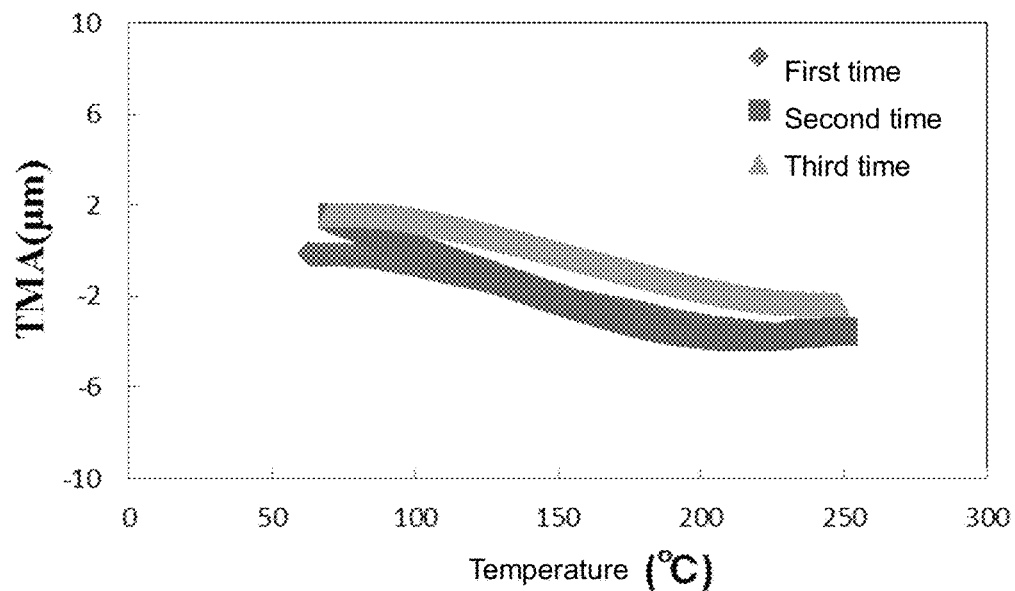
FIGS. 7(a) and 7(b) respectively shows the measured results of thermal expansion coefficients of the samples of Examples 12 and 13.
Figure 7B:
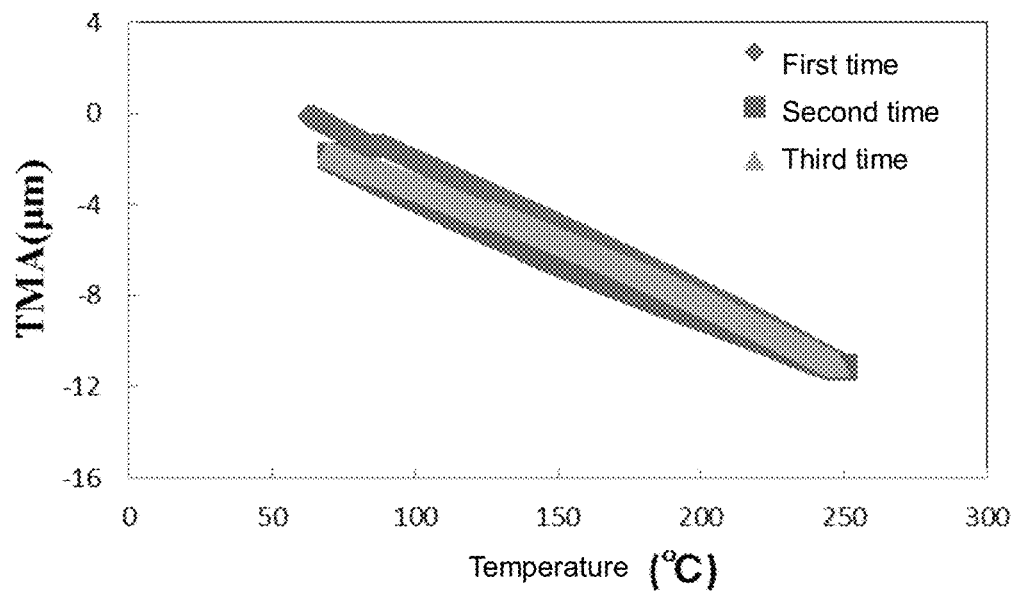

| | Thermal conductivity in planar direction (W/mK) | Thermal conductivity in thickness direction (W/mK) | Thermal expansion coefficient |
|---|---|---|---|
| Example 12 | 53.2 | 8.3 | as shown in FIG. 7(a) |
| Example 13 | 57.1 | 7.68 | as shown in FIG. 7(b) |

Based on the results of Example 12 and Example 13, it can be understood that, when BN particles modified with a coupling agent having an amino group and BN particles modified with a coupling agent having an epoxy group were reacted, a material having a negative thermal expansion coefficient and high thermal conductivity was obtained. In this case, compared to when a bifunctional or higher epoxy was reacted with BN particles (the inorganic filler A and the inorganic filler D) modified with the coupling agent having an amino group as in Example 1 later and an inorganic filler B having an epoxy group was obtained, excess epoxy was unnecessary, and the number of drying and purifying processes could be reduced. Therefore, it was easy to prepare a sample and a loss of a raw material was small. In addition, thermal conductivity was also comparable to that of Example 1 and when inorganic fillers having reactivity to each other were prepared for mass production, high efficiency was considered to be obtained.

All references including publications, patent applications, and patents cited in this specification are referred to and incorporated herein to the same extent as if the references were individually exemplified, referred to and incorporated, and all details thereof are described herein.

The use of nouns and corresponding demonstratives in the context of describing the present invention (especially in the context of the following claims) is to be construed to cover both the singular and the plural unless otherwise specified herein or otherwise clearly contradicted by context. The terms "comprise," "include," "contain," and "have" are interpreted as open-ended terms (that is, to mean "~includes, but is not limited to") unless otherwise noted. Unless otherwise specified in this specification, the numerical ranges of objects in this specification are merely intended to serve as abbreviations for individually indicating values falling within the ranges, and the values are incorporated in this specification as if they were individually recited herein. All methods described herein can be performed in any appropriate order unless otherwise described herein or otherwise clearly contradicted by context. Unless otherwise claimed, any example or exemplary phrase (for example, "such as") used herein is intended merely to better describe the present invention and is not intended to limit the scope of the present invention. Terms in this specification should not be construed to indicate elements that are essential for the implementation of the present invention but are not described in the claims.

This specification includes best modes for implementing the present invention known to the inventors and preferable embodiments of the present invention have been described. Those skilled in the art will clearly understand modifications of such preferable embodiments that may be made upon reading the above description. The inventors expect such skilled people to appropriately apply such modifications and assume that the present invention will be implemented using methods other than those specifically described herein. Accordingly, the present invention includes all modifications and equivalents of content described in the claims appended to this specification as allowed by applicable law. Moreover, the present invention encompasses any combination of the above elements in all of the modifications unless otherwise described herein or clearly contradicted by context.

REFERENCE SIGNS LIST

1 First inorganic filler
2 Second inorganic filler
3,4 Coupling agent
5 Polymerizable compound

The invention claimed is:

1. A composition for a heat dissipating member comprising:
   a first inorganic filler having thermal conductivity that is bonded to one end of a coupling agent; and
   a second inorganic filler having thermal conductivity that is bonded to one end of a coupling agent, in which a bifunctional or higher polymerizable compound is additionally bonded to the other end of the bonded coupling agent;
   wherein the other end of the coupling agent bonded to the first inorganic filler is to be bonded to the polymerizable compound on the second inorganic filler during curing.

2. A composition for a heat dissipating member comprising:
   a first inorganic filler having thermal conductivity that is bonded to one end of a coupling agent; and
   a second inorganic filler having thermal conductivity that is bonded to one end of a coupling agent;
   wherein the coupling agent bonded to the first inorganic filler and the coupling agent bonded to the second inorganic filler each have a functional group for bonding coupling agents, and
   wherein the other end of the coupling agent bonded to the first inorganic filler and the other end of the coupling agent bonded to the second inorganic filler are to be bonded during curing.

3. The composition for a heat dissipating member according to claim 1,
   wherein the first inorganic filler and the second inorganic filler are a nitride or carbon material.

4. The composition for a heat dissipating member according to claim 3,
wherein the first inorganic filler and the second inorganic filler are at least one selected from boron nitride, boron carbide, boron nitride carbon, graphite, a carbon fiber, and a carbon nanotube.

5. The composition for a heat dissipating member according to claim 1, further comprising
a third inorganic filler that has a different thermal expansion coefficient from those of the first inorganic filler and the second inorganic filler, wherein the third inorganic filler has thermal conductivity and is bonded to one end of a coupling agent, or the third inorganic filler has thermal conductivity and is bonded to one end of the coupling agent to which the polymerizable compound is bonded.

6. The composition for a heat dissipating member according to claim 1, further comprising
an organic compound or a polymer compound that is not bonded to the first inorganic filler and the second inorganic filler.

7. The composition for a heat dissipating member according to claim 1,
wherein the bifunctional or higher polymerizable compound is a polymerizable compound having a structure containing an oxiranyl group or an oxetanyl group at both ends.

8. The composition for a heat dissipating member according to claim 7,
wherein the bifunctional or higher polymerizable compound is at least one polymerizable liquid crystal compound represented by the following Formula (1-1).

$$R^{a1}-Z-(A-Z)_{m1}-R^{a1} \quad (1\text{-}1)$$

[in Formula (1-1),
$R^{a1}$ is a polymerizable group represented by any one of the following Formulae (2-1) and (2-2);
A is 1,4-cyclohexylene, 1,4-cyclohexenylene, 1,4-phenylene, naphthalene-2,6-diyl, tetrahydronaphthalene-2,6-diyl, fluorene-2,7-diyl, bicyclo[2.2.2]oct-1,4-diyl, or bicyclo[3.1.0]hex-3,6-diyl,
in the rings, any —CH$_2$— may be replaced with —O—, any —CH= may be replaced with —N=, and any hydrogen may be replaced with a halogen, an alkyl group having 1 to 10 carbon atoms, or an alkyl halide having 1 to 10 carbon atoms,
in the alkyl, any —CH$_2$— may be replaced with —O—, —CO—, —COO—, —OCO—, —CH=CH—, or —C≡C—;
Z independently represents a single bond or an alkylene group having 1 to 20 carbon atoms,
in the alkylene, any —CH$_2$— may be replaced with —O—, —S—, —CO—, —COO—, —OCO—, —CH=CH—, —CF=CF—, —CH=N—, —N=CH—, —N=N—, —N(O)=N—, or and any hydrogen may be replaced with a halogen; and
m1 is an integer of 1 to 6]
[Chem. 1]

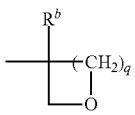

(2-1)

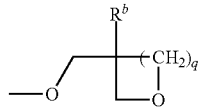

(2-2)

[in Formulae (2-1) and (2-2), $R^b$ is hydrogen, a halogen, —CF$_3$, or an alkyl group having 1 to 5 carbon atoms, and q is 0 or 1.

9. The composition for a heat dissipating member according to claim 8,
wherein, in Formula (1-1), A represents 1,4-cyclohexylene, 1,4-cyclohexylene in which any hydrogen is replaced with a halogen, 1,4-phenylene, 1,4-phenylene in which any hydrogen is replaced with a halogen or a methyl group, fluorene-2,7-diyl, or fluorene-2,7-diyl in which any hydrogen is replaced with a halogen or a methyl group.

10. The composition for a heat dissipating member according to claim 8,
wherein, in Formula (1-1), Z represents a single bond, —(CH$_2$)$_a$—, —O(CH$_2$)$_a$—, —(CH$_2$)$_a$O—, —O(CH$_2$)$_a$O—, —CH=CH—, —COO—, —OCO—, —CH=CH—COO—, —OCO—CH=CH—, —CH$_2$CH$_2$—COO—, —OCO—CH$_2$CH$_2$—, —CH=N—, —N=CH—, —OCF$_2$— or —CF$_2$O—, and a is an integer of 1 to 20.

11. A heat dissipating member obtained by curing the composition for a heat dissipating member according to claim 1.

12. An electronic apparatus comprising:
the heat dissipating member according to claim 11; and
an electronic device having a heating unit, and
wherein the heat dissipating member is disposed in the electronic device in contact with the heating unit.

13. A method of producing a heat dissipating member comprising:
a process in which a first inorganic filler having thermal conductivity is bonded to one end of a coupling agent;
a process in which a second inorganic filler having thermal conductivity is bonded to one end of a coupling agent;
a process in which the other end of the coupling agent bonded to the second inorganic filler is bonded to a bifunctional or higher polymerizable compound; and
a process in which the other end of the coupling agent bonded to the first inorganic filler is bonded to the bifunctional or higher polymerizable compound on the second inorganic filler.

14. A method of producing a heat dissipating member comprising:
a process in which a first inorganic filler having thermal conductivity is bonded to one end of a coupling agent;
a process in which a second inorganic filler having thermal conductivity is bonded to one end of a coupling agent; and
a process in which the other end of the coupling agent bonded to the first inorganic filler is bonded to the other end of the coupling agent bonded to the second inorganic filler.

* * * * *